US012723167B2

(12) United States Patent
Kishimoto et al.

(10) Patent No.: US 12,723,167 B2
(45) Date of Patent: Sep. 1, 2026

(54) PROCESS

(71) Applicant: SAMSUNG ELECTRONICS CO., LTD., Suwon-si (KR)

(72) Inventors: Tadashi Kishimoto, Tokyo (JP); Yuki Hirayama, Tokyo (JP); Julian Burschka, Darmstadt (DE); Teruaki Suzuki, Tokyo (JP); Nils Greinert, Darmstadt (DE); Denis Glozman, Jerusalem (IL); Ehud Shaviv, Jerusalem (IL); Yaron Aviv, Jerusalem (IL); Elizaveta Kossoy, Jerusalem, IL (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 335 days.

(21) Appl. No.: 18/031,237

(22) PCT Filed: Oct. 11, 2021

(86) PCT No.: PCT/EP2021/078009
§ 371 (c)(1),
(2) Date: Apr. 11, 2023

(87) PCT Pub. No.: WO2022/078939
PCT Pub. Date: Apr. 21, 2022

(65) Prior Publication Data

US 2023/0374325 A1 Nov. 23, 2023

(30) Foreign Application Priority Data

Oct. 12, 2020 (EP) .................................... 20201305
Feb. 16, 2021 (EP) .................................... 21157392

(51) Int. Cl.
*C09D 11/38* (2014.01)
*B41J 2/01* (2006.01)
(Continued)

(52) U.S. Cl.
CPC ................ *C09D 11/38* (2013.01); *B41J 2/01* (2013.01); *B41J 2/2107* (2013.01); *B41J 2/2114* (2013.01);
(Continued)

(58) Field of Classification Search
CPC ... B41J 2/01; B41J 2/211; B41J 2/1433; B41J 2/17; B41J 2/17593; B41J 2/2107;
(Continued)

(56) References Cited

U.S. PATENT DOCUMENTS 6,818,677 B1 * 11/2004 Ito ............................ C08F 2/46 522/28
7,588,828 B2 9/2009 Mushtaq et al.
(Continued)

FOREIGN PATENT DOCUMENTS

EP 3 444 316 A1 2/2019
JP 4-239508 A 8/1992
(Continued)

OTHER PUBLICATIONS

Bauer F et al: "UV curing and matting of acrylate nanocomposite coatings by 172nm excimer irradiation, Part 2", Progress in Organic Coatings, Elsevier BV, NL, vol. 69, No. 3, Nov. 30, 2010 (Nov. 30, 2010), pp. 287-293, XP027235761, ISSN: 0300-9440, [retrieved on Aug. 1, 2010], DOI: doi.org/10.1016/j.porgcoat.2010.07.001.
(Continued)

*Primary Examiner* — Manish S Shah
(74) *Attorney, Agent, or Firm* — Sughrue Mion, PLLC

(57) ABSTRACT

The present invention relates to a process for fabricating cured composition.

20 Claims, 6 Drawing Sheets

(51) Int. Cl.

| | |
|---|---|
| ***B41J 2/21*** | (2006.01) |
| ***B41M 5/40*** | (2006.01) |
| ***C09D 11/033*** | (2014.01) |
| ***C09D 11/037*** | (2014.01) |
| ***C09D 11/101*** | (2014.01) |
| ***C09D 11/107*** | (2014.01) |
| ***C09D 11/32*** | (2014.01) |
| ***C09D 11/322*** | (2014.01) |
| ***C09D 11/50*** | (2014.01) |
| ***G02F 1/13357*** | (2006.01) |
| ***H10K 59/38*** | (2023.01) |

(52) U.S. Cl.

CPC ........... *B41M 5/405* (2013.01); *C09D 11/033* (2013.01); *C09D 11/037* (2013.01); *C09D 11/101* (2013.01); *C09D 11/107* (2013.01); *C09D 11/32* (2013.01); *C09D 11/322* (2013.01); *C09D 11/50* (2013.01); *G02F 1/133617* (2013.01); *H10K 59/38* (2023.02)

(58) Field of Classification Search

CPC ...... B41J 2/1755; B41J 2/2114; B41J 2/2117; B41J 2/2056; B41J 2/21; B41J 2/0057; B41J 3/60; B41J 2002/012; B41J 2/04598; B41J 2/04588; B41J 2/04595; B41J 2/04586; B41J 2/14274; B41J 2/1623; B41J 2202/00; B41J 2202/03; B41J 2/14201; B41J 2/045; B41J 11/0015; B41J 11/002; B41J 2/04581; B41J 2/055; B41J 2/16538; B41J 2002/16502; B41J 29/02; B41J 2/17513; B41J 2/17509; B41J 29/13; B41J 2/17553; B41J 2/1606; B41J 2/1642; B41J 2/1609; B41J 2/164; B41J 2/162; B41J 2/161; B41J 2/19; B41J 15/04; B41J 25/001; B41J 25/34; B41J 25/003; B41J 2/18; B41J 25/312; B41J 2025/008; B41J 2202/21; B41J 2/17596; B41J 2/16508; B41J 2/1652; B41J 2/175; B41J 2/17563; B41M 5/0011; B41M 5/0017; B41M 5/0023; B41M 5/0047; B41M 7/00; B41M 7/0072; B41M 5/52; B41M 5/5218; B41M 5/5227; C09D 11/36; C09D 11/40; C09D 11/30; C09D 11/38; C09D 11/32; C09D 11/322; C09D 11/324; C09D 11/328; C09D 11/101; C09D 11/102; C09D 11/005; C09D 11/54; C09D 11/52; C09D 11/106; C09D 11/326; C09D 11/107; C09D 11/03; C09D 11/037; C09D 11/033

See application file for complete search history.

(56) References Cited

U.S. PATENT DOCUMENTS

| | | | | |
|---|---|---|---|---|
| 8,679,543 | B2 | 3/2014 | Bartel et al. | |
| 9,529,228 | B2 | 12/2016 | Banin et al. | |
| 10,678,134 | B2 | 6/2020 | Hirayama et al. | |
| 11,269,255 | B2 | 3/2022 | Hirayama et al. | |
| 11,579,527 | B2 | 2/2023 | Shibayama et al. | |
| 2003/0098442 | A1* | 5/2003 | Ichihashi | G03F 7/0007 430/7 |
| 2003/0116747 | A1* | 6/2003 | Lem | B05D 3/207 427/598 |
| 2012/0108695 | A1* | 5/2012 | Won | B01J 19/20 422/135 |
| 2012/0147095 | A1* | 6/2012 | Miura | B41J 2/2107 347/102 |
| 2013/0129980 | A1 | 5/2013 | Meinhard et al. | |
| 2014/0363584 | A1* | 12/2014 | Suzuki | H01L 21/3086 427/510 |
| 2015/0098212 | A1 | 4/2015 | Won et al. | |
| 2015/0158304 | A1* | 6/2015 | Kida | C09D 11/324 347/33 |
| 2016/0046813 | A1* | 2/2016 | Tanikawa | B41J 3/407 427/508 |
| 2016/0049297 | A1* | 2/2016 | Tanikawa | C09J 5/00 438/118 |
| 2016/0272885 | A1 | 9/2016 | Bai et al. | |
| 2018/0046080 | A1 | 2/2018 | Suzuki et al. | |
| 2018/0102449 | A1 | 4/2018 | Pschenitzka et al. | |
| 2018/0299102 | A1 | 10/2018 | Chikushi et al. | |
| 2019/0218453 | A1 | 7/2019 | Qiu et al. | |
| 2020/0017762 | A1 | 1/2020 | Mansei et al. | |
| 2020/0157419 | A1 | 5/2020 | Kishimoto et al. | |
| 2022/0098419 | A1* | 3/2022 | Tanikawa | B41J 11/00214 |
| 2022/0204797 | A1 | 6/2022 | Kishimoto et al. | |
| 2023/0052397 | A1 | 2/2023 | Hirayama et al. | |

FOREIGN PATENT DOCUMENTS

| | | | |
|---|---|---|---|
| JP | 2018-55073 | A | 4/2018 |
| JP | 2018-512614 | A | 5/2018 |
| JP | 2018-531421 | A | 10/2018 |
| JP | 2020-129034 | A | 8/2020 |
| TW | 201910484 | A | 3/2019 |
| WO | 2017054898 | A1 | 4/2017 |
| WO | 2019002239 | A1 | 1/2019 |

OTHER PUBLICATIONS

Asmussen Erik et al: "Two-step curing: influence on conversion and softening of a dental polymer", Dental Materials, vol. 19, No. 6, Sep. 30, 2003 (Sep. 30, 2003), Amsterdam, NL, pp. 466-470, XP055895539, ISSN: 0109-5641, DOI: 10.1016/S0109-5641(02)00091-X.

International Search Report PCT/EP2021/078009 dated Mar. 25, 2022 (pp. 1-4) and written opinion (pp. 1-5).

Communication dated Jul. 31, 2025, issued by the Korean Intellectual Property Office in Korean Application No. 10-2023-7015075.

Communication dated Aug. 25, 2025, issued by the China National Intellectual Property Administration in Chinese Application No. 202180019997.3.

Communication dated Sep. 30, 2025, issued by the Japanese Patent Office in Japanese Application No. 2023-521898.

Bauer et al. "UV curing and matting of acrylate nanocomposite coatings by 172nm excimer irradiation, Part 2", Progress in Organinc Coatings, vol. 69, Issue 3, pp. 287-293, Nov. 2010 (8 pages total).

Communication issued on Oct. 28, 2025 by the European Patent Office in European Patent Application No. 21815912.7.

Communication issued on Apr. 15, 2026 by the China National Intellectual Property Administration in Chinese Patent Application No. 202180069588.4.

Communication dated Jun. 24, 2026 issued by the Korean Ministry of Intellectual Property in Korean Patent Application No. 10-2023-7015075.

* cited by examiner

PROCESS

FIELD OF THE INVENTION

The present invention relates to a process for fabricating cured composition, a cured composition, a layer, a color conversion device, use of a color conversion device and an optical device.

BACKGROUND ART

WO 2017/054898 A1 describes a composition comprising red emission type nanocrystals, wetting and dispersing agent, propylene glycol monomethyl ether acetate as a solvent, an acryl polymer mixture including an acrylic unit including an acid group and a silane modified acrylic unit.

WO 2019/002239 A1 discloses a composition comprising a semiconducting light emitting nanoparticles, a polymer and a (meth)acrylate such as 1.4. cyclohexanedimethanol-monoacrylate having high viscosity around 90 cp.

PATENT LITERATURE

1. WO 2017/054898 A1
2. WO 2019/002239 A1

SUMMARY OF THE INVENTION

However, the inventors newly have found that there are still one or more of considerable problems for which improvement is desired, as listed below. $TiO_2$ particles that are typically used as scattering particles in QD inks have a rather high density and combined with the rather large particle size needed for efficient visible light scattering, sedimentation is a common issue. Sedimentation, often caused by aggregation, can lead to issues during ink-jet printing. Hence it is desired to develop an ink that requires less amount of TiO2 or no scattering particles in general to achieve high EQE.

Additionally, the addition of $TiO_2$ leads to a significant increase in viscosity. Therefore, it is desired to provide a QD ink with less or without TiO2 or scattering particles in general which would therefore provide more flexibility for the ink design and selection and concentration of the other ink components.

The benefit of this invention is achieving higher EQE and lower BL for a QD ink without scattering particles or less amount of scattering particles compared to a reference ink, achieving higher haze value of a cured QD ink without scattering particles or less amount of scattering particles compared to a reference ink, and achieving higher haze value of a cured QD ink without scattering particles or less amount of scattering particles compared to a reference ink and higher EQE at the same time possibly realizing lower blue leakage at the same time.

A new process for fabricating cured composition with higher EQE, lower blue leakage, shorter process time, improved haze value after curing, improved curing to polymerize composition and/or realizing lower viscosity of the composition is desired.

Finding best amount of light emitting moieties and scattering particles in the composition to archive lower viscosity, higher EQE, lower blue leakage, good ink jet ability of the composition.

The inventors aimed to solve one or more of the above-mentioned problems.

Then it is found that a novel process for fabricating cured composition comprising at least following steps;

a) irradiating a composition with a light as a $1^{st}$ light irradiation;

b) irradiating the composition with a light as a $2^{nd}$ light irradiation;

wherein the composition comprises at least one light emitting moiety and a reactive monomer, preferably said monomer having one or more of functional groups, more preferably it is a (meth)acrylate monomer;

wherein the intensity of the light of the $1^{st}$ light irradiation and the intensity of the light of the $2^{nd}$ light irradiation satisfies the following formula (I).

$$\text{The intensity of light of the } 1^{st} \text{ light irradiation} < \text{the intensity of light of the } 2^{nd} \text{ light irradiation} \quad (I)$$

In another aspect, the present invention further relates to a cured composition obtained or obtainable from the process of the present invention.

In another aspect, the present invention further relates to a layer obtained or obtainable from the process of the present invention.

In another aspect, the present invention furthermore relates to a layer containing light emitting moieties, a matrix material and scattering particles, wherein the total amount of the light emitting moieties is in the range from 0.1 wt. % to 90 wt. % based on the total amount of the layer, more preferably from 10 wt. % to 70 wt. %, even more preferably from 30 wt. % to 50 wt. %; and wherein the total amount of the scattering particles is 10 wt % or less based on the total amount of the layer, preferably it is in the range from 5 to 1 wt %, more preferably it is in the range from 4 to 2 wt %, preferably the layer is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

In another aspect, the present invention also relates to a color conversion device (100) comprising at least a $1^{st}$ pixel (161) partly or fully filled with the cured composition of the present invention or filled with the layer of any one of the present invention, and a bank (150) comprising at least a polymer material, preferably the color conversion device (100) further contains a supporting medium (170).

In another aspect, the present invention relates to use of the color conversion device (100) in an optical device (300) containing at least one functional medium (320, 420, 520) configured to modulate a light or configured to emit light.

Further, in another aspect, the present invention relates to an optical device (300) containing at least one functional medium (320, 420, 520) configured to modulate a light or configured to emit light, and the color conversion device (100) of the present invention.

Further advantages of the present invention will become evident from the following detailed description.

LIST OF REFERENCE SIGNS IN FIG. 1

Figure 1:
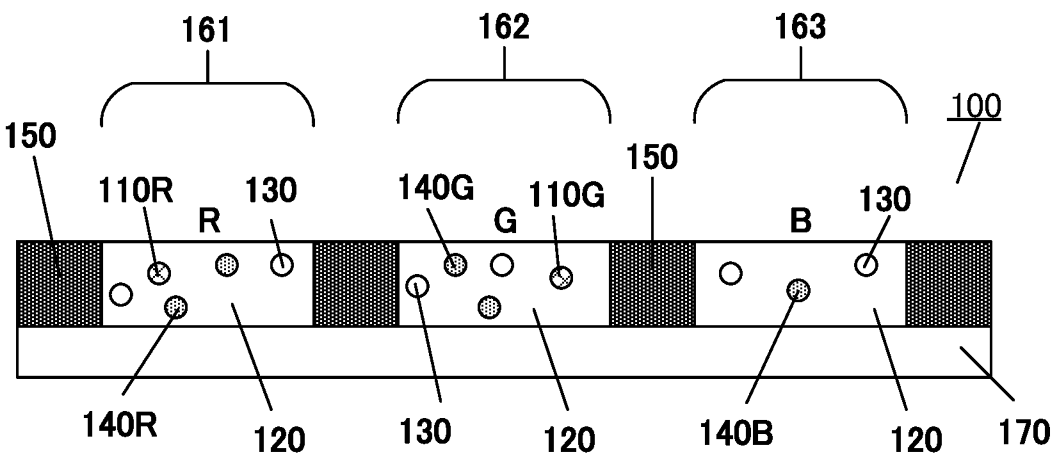
FIG. 1: shows a cross sectional view of a schematic of one embodiment of a color conversion film (100).
Figure 2:
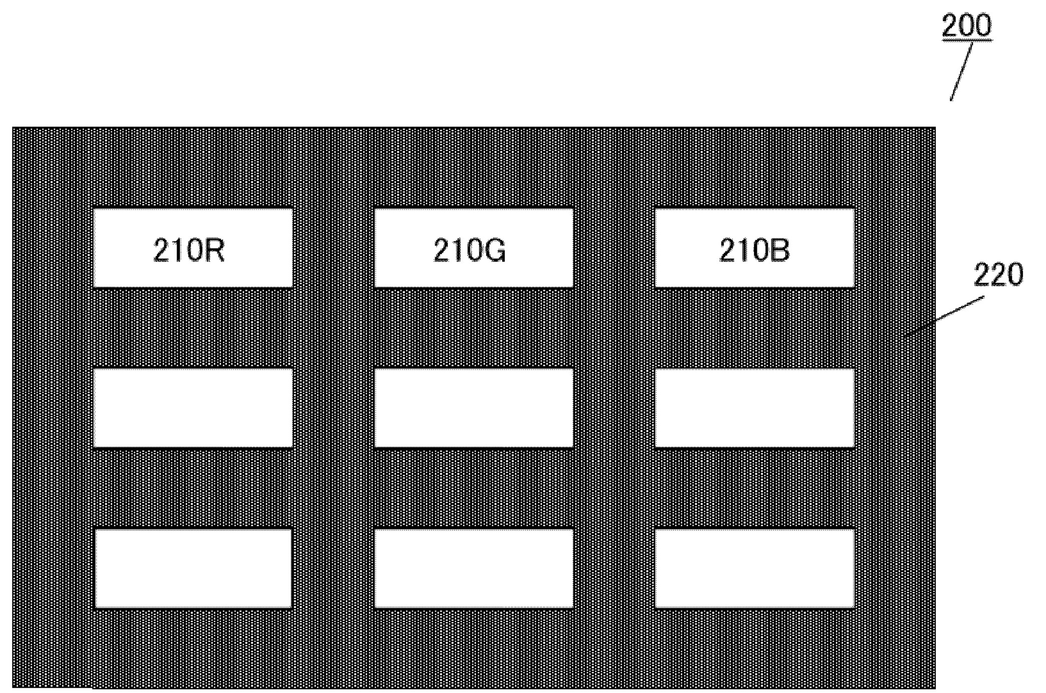
FIG. 2: shows a top view of a schematic of another embodiment of a color conversion film (100) of the invention.
Figure 3:
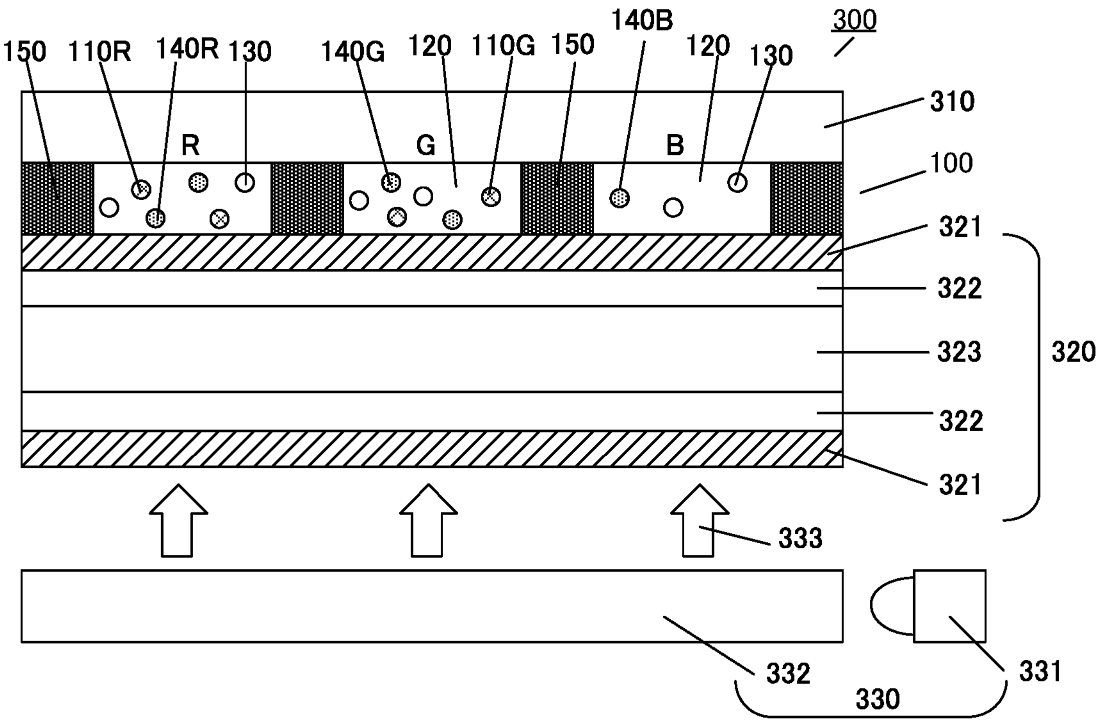
FIG. 3: shows a cross sectional view of a schematic of one embodiment of an optical device (300) of the invention.

100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
161. a $1^{st}$ pixel
162. a $2^{nd}$ pixel
163. a $3^{rd}$ pixel
170. a supporting medium (a substrate) (optional)

LIST OF REFERENCE SIGNS IN FIG. 2

200. a color conversion film
210R. a pixel (red)
210G. a pixel (green)
210B. a pixel (blue)
220. a bank

LIST OF REFERENCE SIGNS IN FIG. 3

300. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
320. a light modulator
321. a polarizer
322. an electrode
323. a liquid crystal layer
330. a light source
331. a LED light source
332. a light guiding plate (optional)
333. light emission from the light source (330)

LIST OF REFERENCE SIGNS IN FIG. 4

400. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
420. a light modulator
421. a polarizer
422. an electrode
423. a liquid crystal layer
430. a light source
431. a LED light source
432. a light guiding plate (optional)
440. a color filter
433. light emission from the light source (330)

LIST OF REFERENCE SIGNS IN FIG. 5

500. an optical device
100. a color conversion device
110. a light emitting moiety
110R. a light emitting moiety (red)
110G. a light emitting moiety (green)
120. a matrix material
130. a light scattering particle (optional)
140. a coloring agent (optional)
140R. a coloring agent (red) (optional)
140G. a coloring agent (green) (optional)
140B. a coloring agent (blue) (optional)
150. a bank
520. a light emitting device (e.g. OLED)
521. a TFT
522. an electrode (anode)
523. a substrate
524. an electrode (cathode)
525. light emitting layer (e.g. OLED layer(s))
526. light emission from a light emitting device (520)
530. an optical layer (e.g. polarizer) (optional)
540. a color filter

DEFINITION OF THE TERMS

In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "and/or" includes a combination of all elements and also includes single use of the element.

In the present specification, when a numerical range is indicated using "to" or "-", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, when polymer has a plural types of repeating units, these repeating units copolymerize. These copolymerization are any of alternating copolymerization, random copolymerization, block copolymerization, graft copolymerization, or a mixture of any of these.

According to the present invention, the term "(meth) acrylate polymer" means a methacrylate polymer, an acrylate polymer or a combination of methacrylate polymer and an acrylate polymer.

The term "emission" means the emission of electromagnetic waves by electron transitions in atoms and molecules.

In the present specification, Celsius is used as the temperature unit. For example, 20 degrees means 20 degrees Celsius.

DETAILED DESCRIPTION OF THE INVENTION

Process

According to the present invention, process for fabricating cured composition comprises at least following steps;

a) irradiating a composition with a light as a $1^{st}$ light irradiation;

b) irradiating the composition with a light as a $2^{nd}$ light irradiation;

wherein the composition comprises at least one light emitting moiety and a reactive monomer, preferably said monomer having one or more of functional groups, more preferably it is a (meth)acrylate monomer;

wherein the intensity of the light of the $1^{st}$ light irradiation and the intensity of the light of the $2^{nd}$ light irradiation satisfies the following formula (I).

$$\text{The intensity of light of the } 1^{st} \text{ light irradiation} < \text{the intensity of light of the } 2^{nd} \text{ light irradiation} \quad (I)$$

It is called "2 step curing process" in the present patent application.

It is believed that by applying the above mentioned "2 step curing process", reaction conditions of the composition including reactive monomer(s), light emitting moiety can be well controlled and process time can be shorter and it can be optimized. Then it leads higher EQE value with lower blue leakage, and/or improved haze value of the cured composition (film).

In a preferred embodiment of the present invention, the peak light wavelength of the light of the $1^{st}$ light irradiation and the peak light wavelength of the light of the $2^{nd}$ light irradiation are, independently of each other, in the range from 200 to 450 nm, preferably from 365 to 410 nm, more preferably from 375 to 405 nm. Such peak light wavelength is considered as preferable one for smooth curing of the composition.

In a preferred embodiment of the present invention, the irradiation time of the $1^{st}$ light irradiation at step a) is in the range from 1 second to 500 seconds and the irradiation time of the $2^{nd}$ light irradiation time at step b) is in the range from 1 second to 500 seconds, preferably the irradiation time of the $1^{st}$ light irradiation at step a) is in the range from 2 seconds to 100 seconds and the irradiation time of the $2^{nd}$ light irradiation time at step b) is in the range from 2 seconds to 100 seconds, more preferably the irradiation time of the $1^{st}$ light irradiation at step a) is in the range from 3 seconds to 50 seconds and the irradiation time of the $2^{nd}$ light irradiation time at step b) is in the range from 5 second to 50 seconds, even more preferably more preferably the irradiation time of the $1^{st}$ light irradiation at step a) is in the range from 4 seconds to 20 seconds and the irradiation time of the $2^{nd}$ light irradiation time at step b) is in the range from 7 second to 20 seconds.

It is believed that by applying $1^{st}$ light irradiation, the composition starts polymerization. The light intensity of the $1^{st}$ light irradiation is weaker than the light intensity of the $2^{nd}$ light irradiation. Therefore, under milder curing condition, the composition can mildly polymerize. Then by applying the $2^{nd}$ light irradiation with stronger light intensity, the composition can be well polymerized. Then it leads higher EQE value of the cured composition and lower blue light leakage of the cured composition. Further, by applying the 2 step curing process, process time can be freely controlled and shorter process time can be realized.

In a preferable embodiment of the present invention, the intensity of light of the $1^{st}$ light irradiation at step (a) is in the range from 0.1 $mW/cm^2$ to 20 $mW/cm^2$ and the intensity of light of the $2^{nd}$ light irradiation at step (b) is in the range from 20 $mW/cm^2$ to 100 $W/cm^2$, preferably the intensity of light of the $1^{st}$ light irradiation at step (a) is in the range from 0.5 $mW/cm^2$ to 10 $mW/cm^2$ and the intensity of light of the $2^{nd}$ light irradiation at step (b) is in the range from 100 $mW/cm^2$ to 10 $W/cm^2$, more preferably the intensity of light of the $1^{st}$ light irradiation at step (a) is in the range from 1 $mW/cm^2$ to 5 $mW/cm^2$ and the intensity of light of the $2^{nd}$ light irradiation at step (b) is in the range from 200 $mW/cm^2$ to 5 $W/cm^2$.

It is believed that by selecting above mentioned light intensity, improved EQE value, lower blue light leakage and optimized shorter process time, and well polymerized cured film (composition) can be realized.

From the view point of realizing higher EQE, irradiating composition with light having lower light intensity until the composition polymerized is suitable. Preferably, total energy of light irradiation is in the range from 900 $mJ/cm^2$ to 5 $J/cm^2$. More preferably it is around 2-3 $J/cm^2$.

In a preferred embodiment of the present invention, the composition contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.

In a preferred embodiment of the present invention, the composition comprises scattering particles, wherein the total amount of the scattering particles is 10 wt % or less based on the total amount of the solid contents of the composition, preferably 10 to 0 wt %, more preferably it is in the range from 5 to 1 wt %, even more preferably it is in the range from 4 to 2 wt %.

It is believed that above mentioned range is preferable from the view point of suitable viscosity of the composition for especially ink jetting, good dispersibility of the scattering particles, higher EQE value and/or improved haze value after curing the composition.

In another aspect, only $1^{st}$ light irradiation may also be applied without applying "2 step curing process" from the view point of realizing further improved EQE value and haze value of the cured film/composition. In this case, there is no $2^{nd}$ irradiation step is applied to the composition. The $1^{st}$ light irradiation is applied until the composition is cured with the above mentioned lower intensity.

In this case, the intensity of light of the $1^{st}$ light irradiation at step (a) is in the range from 0.1 $mW/cm^2$ to 20 $mW/cm^2$ and there is no $2^{nd}$ light irradiation, preferably the intensity of light of the $1^{st}$ light irradiation at step (a) is in the range from 0.5 $mW/cm^2$ to 10 $mW/cm^2$, more preferably the intensity of light of the $1^{st}$ light irradiation at step (a) is in the range from 1 $mW/cm^2$ to 5 $mW/cm^2$.

Preferably, total energy of light irradiation is in the range from 900 $mJ/cm^2$ to 5 $J/cm^2$. More preferably it is around 2-3 $J/cm^2$.

Reactive Monomer

According to the present invention, the composition used for process contains at least one reactive monomer, preferably said monomer contains one or more of functional groups, more preferably it is a (meth)acrylate monomer.

In a preferred embodiment of the present invention, said (meth)acrylate monomer is selected from a mono-(meth) acrylate monomer, a di-(meth)acrylate monomer or a tri-(meth)acrylate monomer more preferably it is a di-methacrylate monomer or a di-acrylate monomer, tri-methacrylate monomer, tri-acrylate monomer even more preferably it is represented by following chemical formula (I), (I)

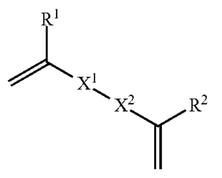

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

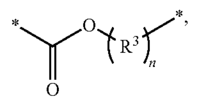

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

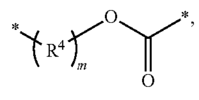

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

In a preferred embodiment of the present invention, the viscosity of the composition is 35 cP or less at room temperature, preferably in the range from 1 to 35 cP, more preferably from 2 to 30 cP, even more preferably from 2 to 25 cP.

According to the present invention, said viscosity can be measured by vibration type viscometer VM-10A (SEKONIC) at room temperature. https://www.sekonic-.co.jp/english/product/viscometer/vm/vm_series.html It is believed that the lower viscosity is important to make a low viscosity composition suitable for inkjet printing. Therefore, a (meth)acrylate monomer having the viscosity value within the above-mentioned parameter ranges are especially suitable to make a composition for inkjet printing. By using these (meth)acrylate monomer in a composition, when it is mixed with another material such as semiconducting light emitting nanoparticles with high loading, the composition can still keep lower viscosity within the range suitable for inkjet printing.

In a preferred embodiment of the present invention, the boiling point (B.P.) of said (meth)acrylate monomer of chemical formula (I) is 250° C. or more, preferably it is in the range from 250° C. to 350° C., even more preferably from 280° C. to 350° C., further more preferably from 300° C. to 348° C. for large area uniform inkjet printing.

It is believed that said high boiling point is also important to make a composition having a lower vapor pressure preferably less than 0.001 mmHg for large area uniform printing, it is preferable to use a (meth)acrylate monomer of formula (I) having the viscosity value of 25 cP or less at 25° C. and the boiling point at least 250° C. or more, preferably it is in the range from 250° C. to 350° C., more preferably from 300° C. to 348° C. to make a composition suitable for large area uniform inkjet printing even if it is mixed with high loading of another materials such as high loading of semiconducting light emitting nanoparticles.

According to the present invention, said B.P can be estimate by the known method such as like described in Science of Petroleum, Vol. II. p. 1281 (1398), https://www.sigmaaldrich.com/chemistry/solvents/learning-center/nomograph.html.

According to the present invention, any types of publicly available acrylates and/or methacrylates represented by chemical formula (I) can be used preferably.

Especially for the first aspect, any types of publicly available acrylates and/or methacrylates having the viscosity value of 25 cP or less at 25° C. represented by chemical formula (I) can be used.

Furthermore preferably, said $R^3$ of formula (I) and $R^4$ of formula (I) are, each independently of each other, selected from the following groups, wherein the groups can be substituted with $R^a$, preferably they are unsubstituted by $R^a$.

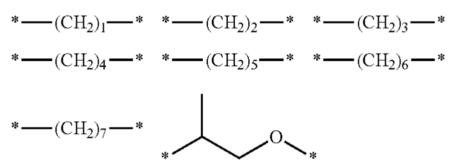

-continued

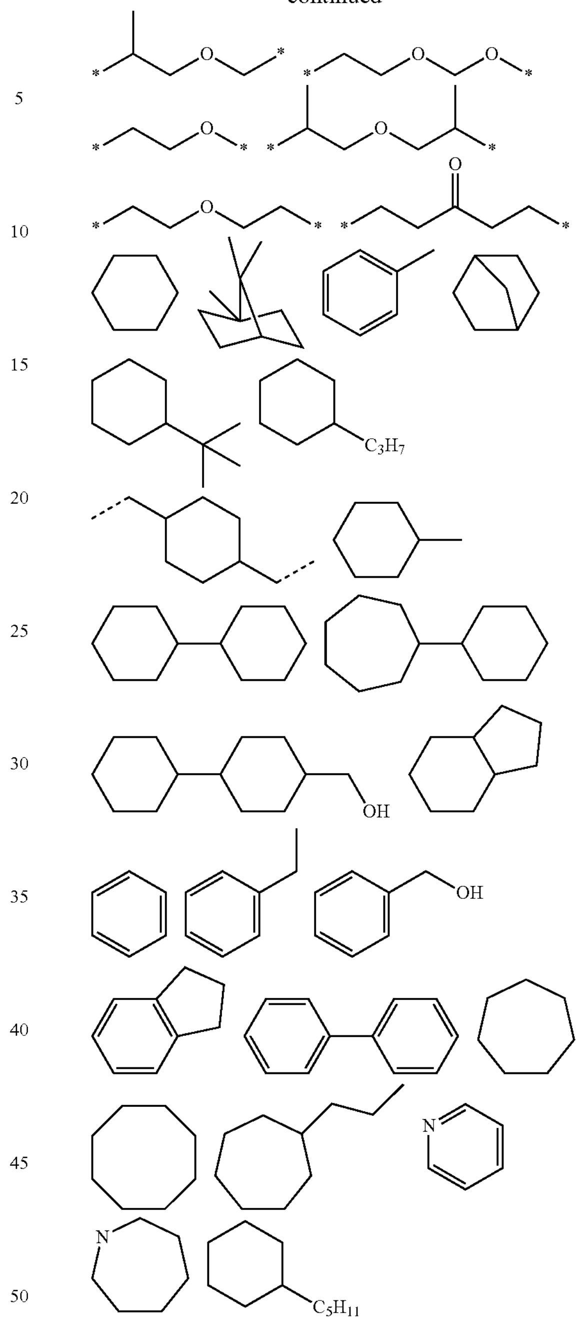

Particularly preferably, said $R^3$ and $R^4$ of formula (I) are, at each occurrence, independently or differently, selected from the following groups.

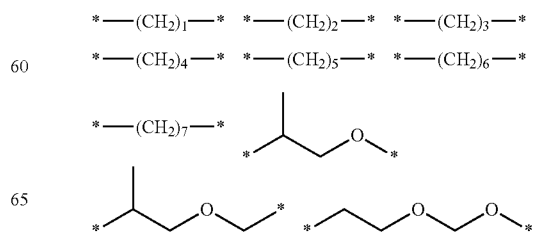

-continued

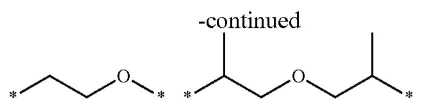

wherein "*" represents the connecting point to oxygen atom of the formula or the connecting point to $X^2$ of the formula in case of $R^3$, and wherein "*" represents the connecting point to oxygen atom of the formula or the connecting point to $X^1$ of the formula in case of $R^4$.

Furthermore preferably, said formula (I) is NDDA (nonanediol diacrylate; BP: 342° C.), HDDMA (hexanediol dimethacrylate; BP: 307), HDDA (hexanediol diacrylate; BP: 295° C.) or DPGDA (BP: 314° C.).

(DPGDA)

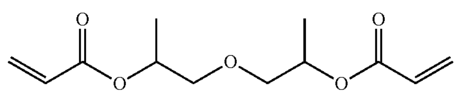

Another Reactive Monomer

According to the present invention, in a preferable embodiment, the composition further comprises an another reactive monomer, preferably said another reactive monomer having one or more of functional groups, more preferably it is a (meth)acrylate monomer different from the (meth)acrylate monomer of chemical formula (I), preferably said another (meth)acrylate monomer is a mono-(meth) acrylate monomer, more preferably it is a mono-methacrylate monomer or mono-acrylate monomer, even more preferably it is represented by following chemical formula (II).

(II)

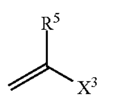

$X^3$ is a non-substituted or substituted alkyl group, aryl group or an alkoxy group;

preferably the symbol $X^3$ is

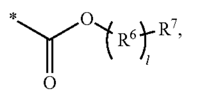

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

It is believed that the (meth)acrylate monomer represented by following chemical formula (II) shows much lower viscosity value than the viscosity of the (meth)acrylate monomer of formula (I). Thus, by using the (meth)acrylate monomer represented by chemical formula (II) in combination of the (meth)acrylate monomer of chemical formula (I), a composition having much lower viscosity desirable for smooth inkjet printing can be realized, preferably without decreasing External Quantum Efficiency (EQE) value.

It is believed that said combination can realize a low viscosity composition comprising high amount of another materials, such as high loading of semiconducting light emitting nanoparticles. Thus, it is especially suitable for an inkjet printing when the composition comprises another material.

In a preferable embodiment of the present invention, the boiling point (B.P.) of said (meth)acrylate monomer of chemical formula (II) is 250° C. or more, preferably the (meth)acrylate monomer of chemical formula (II) is 250° C. or more, more preferably it is in the range from 250° C. to 350° C., even more preferably from 280° C. to 350° C., further more preferably from 300° C. to 348° C. for large area uniform inkjet printing.

In a further preferable embodiment of the present invention, the boiling point (B.P.) of said (meth)acrylate monomer of chemical formula (I) and/or the boiling point (B.P.) of said (meth)acrylate monomer of chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C. for large area uniform inkjet printing.

Furthermore preferably, said $R^7$ of formula (II) is, at each occurrence, independently or differently, selected from the following groups, wherein the groups can be substituted with $R^a$, preferably they are unsubstituted by $R^a$.

| | | |
|---|---|---|
| $*-(CH_2)_6-CH_3$ | $*-(CH_2)_7-CH_3$ | $*-(CH_2)_8-CH_3$ |
| $*-(CH_2)_9-CH_3$ | $*-(CH_2)_{10}-CH_3$ | $*-(CH_2)_{11}-CH_3$ |
| $*-(CH_2)_{12}-CH_3$ | $*-(CH_2)_4-OH$ | $*-(CH_2)_2-OH$ |
| $*-(CH_2)_6-OH$ | $*-(CH_2)_3-OH$ | $*-(CH_2)_5-OH$ |

wherein "*" represents the connecting point to $R^6$ of $X^3$ in case I is 1, and it is representing the connecting point to oxygen atom of $X^3$ of the formula (II) in case n is 0.

The furthermore preferably, said formula (II) is Lauryl methacrylate (LM, viscosity 6 cP, BP: 142° C.) or Lauryl acrylate (LA, viscosity: 4.0 cP, BP: 313.2° C.).

In a preferred embodiment of the present invention, the (meth)acrylate monomer of chemical formula (II) is in the composition and the mixing ratio of the (meth)acrylate monomer of chemical formula (I) to the (meth)acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 25:75, preferably at least a purified (meth)acrylate monomer represented by chemical formula (I), (II) is used in the composition, more preferably the (meth)acrylate monomer of chemical formula (I) and the (meth)acrylate monomer of chemical formula (II) are both obtained or obtainable by a purification method.

It is believed that the higher amount of the (meth)acrylate monomer of chemical formula (II) to the total amount of the (meth)acrylate monomer of chemical formula (I) leads improved EQE of the composition, and the mixing weight ratio of the (meth)acrylate monomer of chemical formula (II) to the total amount of the (meth)acrylate monomer of chemical formula (I) less than 50 wt. % is preferable from the view point of viscosity of the composition, better ink-jetting properties of the composition.

Preferably, reactive monomers, such as (meth)acrylate monomers are purified by using silica column or purified by passed through molecular sieve prior to use.

It is believed that an impurity removal from the (meth) acrylate monomers by the silica column purification leads improved QY of the semiconducting light emitting nanoparticle in the composition.

In some embodiments of the present invention, the composition further comprises a (meth)acrylate monomer represented by following chemical formula (III);

(III)

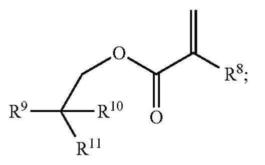

wherein $R^9$ is hydrogen atom, a straight alkyl group having 1 to 25 carbon atoms or a (meth)acryl group represented by chemical formula (IV)

(IV)

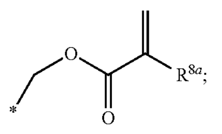

$R^6$ is hydrogen atom, a straight alkyl group having 1 to 25 carbon atoms or a (meth)acryl group represented by chemical formula (V)

(V)

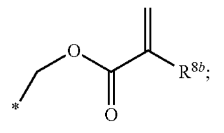

$R^7$ is hydrogen atom, a straight alkyl group having 1 to 25 carbon atoms or a (meth)acryl group represented by chemical formula (VI)

(VI)

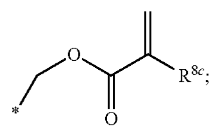

wherein $R^{8a}$, $R^{8b}$ and $R^{8c}$ are, each independently or dependently of each other at each occurrence, H or $CH_3$;

wherein at least one of $R^9$, $R^{10}$ and $R^{11}$ is a (meth)acryl group, preferably two of $R^9$, $R^{10}$ and $R^{11}$ are a (meth) acryl group and other one is a hydrogen atom or a straight alkyl group having 1 to 25 carbon atoms, preferably the electric conductivity (S/cm) of the (meth)acrylate monomer of formula (III) is $1.0*10^{-10}$ or less, preferably it is $5.0*10^{-11}$ or less, more preferably it is in the range from $5.0*10^{-11}$ to $1.0*10^{-15}$, even more preferably it is in the range from $5.0*10^{-12}$ to $1.0*10^{-15}$.

It is believed that the (meth)acrylate monomer of chemical formula (III) is useful to improve its solidity of a later made from the composition after inkjet printing.

According to the present invention, a publicly known a (meth)acrylate monomer represented by following chemical formula (III) can be used to improve solidity of a layer after inkjet printing and cross linking.

Very preferably, Trimethylolpropane Triacrylate (TMPTA) is used as the (meth)acrylate monomer of chemical formula (III).

In a preferable embodiment of the present invention, the amount of the (meth)acrylate monomer of chemical formula (III) based on the total amount of (meth)acrylate monomers in the composition is in the range from 0.001 wt. % to 25 wt. %, more preferably in the range from 0.1 wt. % to 15 wt. %, even more preferably from 1 wt. % to 10 wt. %, further more preferably from 3 to 7 wt %.

Preferably, reactive monomers, such as (meth)acrylate monomers are purified by using silica column or purified by passed through molecular sieve prior to use.

It is believed that an impurity removal from the (meth) acrylate monomers by the silica column purification leads improved QY of the semiconducting light emitting nanoparticle in the composition.

According to the present invention, in a preferred embodiment, the viscosity of the composition is 35 cP or less at room temperature, preferably in the range from 1 to 35 cP, more preferably from 2 to 30 cP, even more preferably from 2 to 25 cP.

In a preferred embodiment of the present invention, the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecylbenzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol monoalkyl ethers, propylene glycol, and propylene glycol monoalkyl ethers.

It is believed that the less than 10 wt % of solvent in the composition leads improved ink-jetting and it can avoid $2^{nd}$ or more ink-jetting onto the same pixel after evaporation of the solvent.

Light Emitting Moiety (110)

In a preferable embodiment of the present invention, said light emitting moiety is an organic light emitting material and/or an inorganic light emitting material, preferably said organic light emitting materials is an organic dye, or an organic light emitting material for organic light emitting diode device, preferably said inorganic light emitting material is an inorganic phosphor and/or a semiconducting light emitting nanoparticle such as a quantum (sized) material.

In some embodiments of the present invention, the total amount of the light emitting moiety (110) is in the range from 0.1 wt. % to 90 wt. % based on the total amount of the $1^{st}$ pixel (161), preferably from 10 wt. % to 70 wt. %, more preferably from 30 wt. % to 50 wt. %.

iii) Semiconducting Light Emitting Nanoparticle

According to the present invention, the term "semiconductor" means a material that has electrical conductivity to a degree between that of a conductor (such as copper) and that of an insulator (such as glass) at room temperature. Preferably, a semiconductor is a material whose electrical conductivity increases with the temperature.

The term "nanosized" means the size in between 0.1 nm to 150 nm, more preferably 3 nm to 50 nm.

Thus, according to the present invention, "semiconducting light emitting nanoparticle" is taken to mean that the light emitting material which size is in between 0.1 nm to 150 nm, more preferably 3 nm to 50 nm, having electrical conductivity to a degree between that of a conductor (such as copper) and that of an insulator (such as glass) at room temperature, preferably, a semiconductor is a material whose electrical conductivity increases with the temperature, and the size is in between 0.1 nm and 150 nm, preferably 0.5 nm to 150 nm, more preferably 1 nm to 50 nm.

According to the present invention, the term "size" means the average diameter of the longest axis of the semiconducting nanosized light emitting particles.

The average diameter of the semiconducting nanosized light emitting particles is calculated based on 100 semiconducting light emitting nanoparticles in a TEM image created by a Tecnai G2 Spirit Twin T-12 Transmission Electron Microscope.

In a preferred embodiment of the present invention, the semiconducting light emitting nanoparticle of the present invention is a quantum sized material.

According to the present invention, the term "quantum sized" means the size of the semiconducting material itself without ligands or another surface modification, which can show the quantum confinement effect, like described in, for example, ISBN:978-3-662-44822-9.

For example, CdS, CdSe, CdTe, ZnS, ZnSe, ZnSeS, ZnTe, ZnO, GaAs, GaP, GaSb, HgS, HgSe, HgSe, HgTe, InAs, InP, InPZn, InPZnS, InPZnSe, InPZnSeS, InPZnGa, InPGaS, InPGaSe, InPGaSeS, InPZnGaSeS and InPGa, InCdP, InPCdS, InPCdSe, InSb, AlAs, AlP, AlSb, $Cu_2S$, $Cu_2Se$, CuInS2, $CuInSe_2$, $Cu_2(ZnSn)S_4$, $Cu_2(InGa)S_4$, $TiO_2$ alloys and a combination of any of these can be used.

In a preferred embodiment of the present invention, the $1^{st}$ semiconducting material comprises at least one element of the group 13 of the periodic table, and one element of the group 15 of the periodic table, preferably the element of the group 13 is In, and the element of the group 15 is P, more preferably the $1^{st}$ semiconducting material is selected from the group consisting of InP, InPZn, InPZnS, InPZnSe, InPZnSeS, InPZnGa, InPGaS, InPGaSe, InPGaSeS, InPZnGaSeS and InPGa.

According to the present invention, a type of shape of the core of the semiconducting light emitting nanoparticle, and shape of the semiconducting light emitting nanoparticle to be synthesized are not particularly limited.

For examples, spherical shaped, elongated shaped, star shaped, polyhedron shaped, pyramidal shaped, tetrapod shaped, tetrahedron shaped, platelet shaped, cone shaped, and irregular shaped core and—or a semiconducting light emitting nanoparticle can be synthesized.

In some embodiments of the present invention, the average diameter of the core is in the range from 1.5 nm to 3.5 nm.

The average diameter of the core is calculated based on 100 semiconducting light emitting nanoparticles in a TEM image created by a Tecnai G2 Spirit Twin T-12 Transmission Electron Microscope.

In some embodiments of the present invention, at least one the shell layer comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te; preferably a first shell layer covering directly onto said core comprises or a consisting of a $1^{st}$ element of group 12 of the periodic table and a $2^{nd}$ element of group 16 of the periodic table, preferably, the $1^{st}$ element is Zn, and the $2^{nd}$ element is S, Se, or Te.

In a preferred embodiment of the present invention, at least one shell layer (a first shell layer) is represented by following formula (XI), preferably the shell layer directly covering the core is represented by the chemical formula (XI);

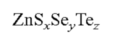

$$ZnS_xSe_yTe_z \quad (XI)$$

wherein $0 \le x \le 1$, $0 \le y \le 1$, $0 \le z \le 1$, and $x+y+z=1$, preferably $0 \le x \le 1$, $0 \le y \le 1$, $z=0$, and $x+y=1$, preferably, the shell layer is ZnSe, $ZnS_xSe_y$, $ZnSe_yTe_z$ or $ZnS_xTe_z$.

In some embodiments of the present invention, said shell layer is an alloyed shell layer or a graded shell layer, preferably said graded shell layer is $ZnS_xSe_y$, $ZnSe_yTe_z$, or $ZnS_xTe_z$, more preferably it is $ZnS_xSe_y$.

In some embodiments of the present invention, the semiconducting light emitting nanoparticle further comprises $2^{nd}$ shell layer onto said shell layer, preferably the $2^{nd}$ shell layer comprises or a consisting of a $3^{rd}$ element of group 12 of the periodic table and a $4^{th}$ element of group 16 of the periodic table, more preferably the $3^{rd}$ element is Zn, and the $4^{th}$ element is S, Se, or Te with the proviso that the $4^{th}$ element and the $2^{nd}$ element are not same.

In a preferred embodiment of the present invention, the $2^{nd}$ shell layer is represented by following formula (XI'),

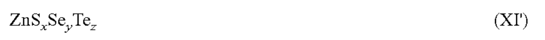

$ZnS_xSe_yTe_z$ (XI')

wherein $0 \le x \le 1$, $0 \le y \le 1$, $0 \le z \le 1$, and $x+y+z=1$, preferably, the shell layer is ZnSe, $ZnS_xSe_y$, $ZnSe_yTe_z$, or $ZnS_xTe_z$ with the proviso that the shell layer and the $2^{nd}$ shell layer is not the same.

In some embodiments of the present invention, said $2^{nd}$ shell layer can be an alloyed shell layer.

In some embodiments of the present invention, the semiconducting light emitting nanoparticle can further comprise one or more additional shell layers onto the $2^{nd}$ shell layer as a multishell.

According to the present invention, the term "multishell" stands for the stacked shell layers consisting of three or more shell layers.

For example, CdSe/CdS, CdSeS/CdZnS, CdSeS/CdS/ZnS, ZnSe/CdS, CdSe/ZnS, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS, InZnPS/ZnS, InZnPS ZnSe, InZnPS/ZnSe/ZnS, ZnSe/CdS, ZnSe/ZnS or combination of any of these, can be used. Preferably, InP/ZnS, InP/ZnSe, InP/ZnSe/ZnS, InZnP/ZnS, InZnP/ZnSe, InZnP/ZnSe/ZnS, InGaP/ZnS, InGaP/ZnSe, InGaP/ZnSe/ZnS.

Such semiconducting light emitting nanoparticles are publicly available (for example from Sigma Aldrich) and/or can be synthesized with the method described for example in U.S. Pat. Nos. 7,588,828 B, 8,679,543 B and Chem. Mater. 2015, 27, pp 4893-4898.

In some embodiments of the present invention, the composition comprises two or more semiconducting light emitting nanoparticles.

In some embodiments of the present invention, the composition comprises a plurality of semiconducting light emitting nanoparticles.

In some embodiments of the present invention, the total amount of the semiconducting light emitting nanoparticles is in the range from 0.1 wt. % to 90 wt. % based on the total amount of the composition, preferably from 10 wt. % to 70 wt. %, more preferably from 30 wt. % to 50 wt. %.

Ligands

In some embodiments of the present invention, optionally, the semiconducting light emitting nanoparticle can be directly over coated by one or more ligands, or the outer most surface of the inorganic part of the semiconducting light emitting nanoparticle can be directly coated by the additional ligand and the additional ligand is further coated by the polymer.

As the additional ligands, phosphines and phosphine oxides such as Trioctylphosphine oxide (TOPO), Trioctylphosphine (TOP), and Tributylphosphine (TBP); phosphonic acids such as Dodecylphosphonic acid (DDPA), Tridecylphosphonic acid (TDPA), Octadecylphosphonic acid (ODPA), and Hexylphosphonic acid (HPA); amines such as Oleylamine, Dedecyl amine (DDA), Tetradecyl amine (TDA), Hexadecyl amine (HDA), and Octadecyl amine (ODA), Oleylamine (OLA), 1-Octadecene (ODE), thiols such as hexadecane thiol and hexane thiol; mercapto carboxylic acids such as mercapto propionic acid and mercaptoundecanoicacid; carboxylic acids such as oleic acid, stearic acid, myristic acid; acetic acid, Polyethylenimine (PEI), monofunctional PEG thiol (mPEG-thiol) or a derivatives of mPEG thiol and a combination of any of these can be used.

Examples of such ligands have been described in, for example, the laid-open international patent application No. WO 2012/059931A.

Scattering Particles

According to the present invention, as the scattering particles, publicly known small particles of inorganic oxides such as $SiO_2$, $SnO_2$, CuO, CoO, $Al_2O_3$ $TiO_2$, $Fe_2O_3$, $Y_2O_3$, ZnO, ZnS, MgO; organic particles such as polymerized polystyrene, polymerized PMMA; inorganic hollow oxides such as hollow silica or a combination of any of these; can be used. The amount of the scattering particles is preferably 4 wt % or less based on the total amount of the solid contents of the layer, preferably it is in the range from 4 to 0 wt %, more preferably it is in the range from 1 to 0 wt %, more preferably the layer and/or the composition does not contain any scattering particles.

In some embodiments of the present invention, the composition comprises iii) at least one semiconducting light emitting nanoparticle comprising a $1^{st}$ semiconducting nanoparticle, optionally one or more shell layers covering at least a part of the $1^{st}$ semiconducting nanoparticle, preferably the composition has EQE value 23% or more, preferably 24% or more and less than 95%.

According to the present invention, as a transparent polymer, a wide variety of publicly known transparent polymers suitable for optical devices, described in for example, WO 2016/134820A can be used preferably.

According to the present invention, the term "transparent" means at least around 60% of incident light transmit at the thickness used in an optical medium and at a wavelength or a range of wavelength used during operation of an optical medium. Preferably, it is over 70%, more preferably, over 75%, the most preferably, it is over 80%.

According to the present invention the term "polymer" means a material having a repeating unit and having the weight average molecular weight (Mw) 1000 g/mol, or more.

The molecular weight $M_w$ is determined by means of GPC (=gel permeation chromatography) against an internal polystyrene standard.

In some embodiments of the present invention, the glass transition temperature (Tg) of the transparent polymer is 70° C. or more and 250° C. or less.

Tg is measured based on changes in the heat capacity observed in Differential scanning colorimetry like described in http://pslc.ws/macrog/dsc.htm; Rickey J Seyler, Assignment of the Glass Transition, ASTM publication code number (PCN) 04-012490-50.

For example, as the transparent polymer for the transparent matrix material, poly(meth)acrylates, epoxys, polyurethanes, polysiloxanes, can be used preferably.

In a preferred embodiment of the present invention, the weight average molecular weight (Mw) of the polymer as the transparent matrix material is in the range from 1,000 to 300,000 g/mol, more preferably it is from 10,000 to 250,000 g/mol.

According to the present invention, publicly known anti-oxidants, radical quenchers, photo initiators and/or surfactants can be used preferably like described in WO 2016/134820A.

According to the present invention, preferably the composition further comprises an another material selected from one or more members of the group consisting of;

A) another light emitting moiety, which is different from the light emitting moiety of claim 1, preferably said light emitting moiety is an organic light emitting material and/or an inorganic light emitting material, more preferably said organic light emitting materials is an organic dye, or an organic light emitting material for organic light emitting diode device, more preferably said inorganic light emitting material is an inorganic phosphor and/or a quantum material, preferably said light emitting moiety comprises a ligand, more preferably said light emitting moiety comprises an alkyl or alkenyl type ligand having carbon atoms 2 to 25;

B) another (meth)acrylate monomer; and

C) optically transparent polymers, anti-oxidants, radical quenchers, photo initiators and/or surfactants.

In some embodiments of the present invention, preferably the composition of the present invention comprises v) scattering particles; and vii) at least one polymer configured so that said polymer enables to the scattering particles to disperse in the composition;

wherein the polymer comprises at least a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the polymer comprises a tertiary amine, phosphine oxide group, phosphonic acid, or a phosphate group.

According to the present invention, the polymer configured so that said polymer enables to the scattering particles to disperse in the composition comprises at least a repeating unit A comprising a phosphine group, phosphine oxide group, phosphate group, phosphonate group, thiol group, tertiary amine, carboxyl group, hetero cyclic group, silane group, sulfonic acid, hydroxyl group, phosphonic acid, or a combination of thereof, preferably the repeating unit A comprises a tertiary amine, phosphine oxide group, phosphonic acid, or a phosphate group.

In some embodiments of the present invention, the repeating unit A and the repeating unit B are a constitutional repeating unit.

Even more preferably, the repeating unit A comprises a tertiary amine represented by following chemical formula (VII),

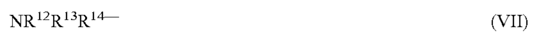

$NR^{12}R^{13}R^{14}—$ (VII)

wherein $R^{12}$ is a hydrogen atom, a straight or a branched alkyl group having 1 to 30 carbon atoms, or an aryl group having 1 to 30 carbon atoms; $R^{13}$ is a hydrogen atom, a straight or a branched alkyl group having 1 to 30 carbon atoms, or an aryl group having 1 to 30 carbon atoms; $R^{12}$ and $R^{13}$ can be same or different of each other; $R^{14}$ is a single bond, a straight or a branched alkylene group having 1 to 30 carbon atoms, alkenylene group having 1 to 30 carbon atoms, (poly) oxaalkylene group having 1 to 30 carbon atoms.

Even more preferably, $R^{12}$ is a straight or a branched alkyl group having 1 to 30 carbon atoms; $R^{13}$ is a straight or a branched alkyl group having 1 to 30 carbon atoms; $R^{12}$ and $R^{13}$ can be same or different of each other.

Furthermore preferably, $R^{12}$ is methyl group, ethyl group, n-propyl group, or n-butyl group; $R^{13}$ is methyl group, ethyl group, n-propyl group, or n-butyl group.

According to the present invention, in a preferred embodiment, the repeating unit A does not contain a salt.

In a preferred embodiment of the present invention, the polymer is a copolymer selected from the group consisting of graft copolymers, block copolymers, alternating copolymers, and random copolymers, preferably said copolymer comprises the repeating unit A, and repeating unit B that does not include any phosphine group, phosphine oxide group, phosphate group, phosphonate group, thiol group, tertiary amine, carboxyl group, hetero cyclic group, silane group, sulfonic acid, hydroxyl group, phosphonic acid, and a combination of thereof, more preferably the copolymer is a block copolymer represented by following chemical formula (VIII) or (IX),

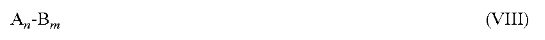

$A_n$-$B_m$ (VIII)

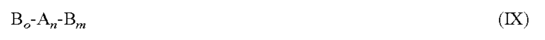

$B_o$-$A_n$-$B_m$ (IX)

wherein the symbol "A" represents a repeating unit A; the symbol "B" is taken to mean the repeating unit B; the symbols "n", "m", and "o" are at each occurrence, independently or dependently of each other, integers 1 to 100, preferably 5 to 75, more preferably 7 to 50; even more preferably the repeating unit B comprises a polymer chain selected from the group consisting of (poly)ethylene, (poly)phenylene, polydivinylbenzene, (poly)ethers, (poly)esters, (poly)amides, (poly)urethanes, (poly)carbonates, polylactic acids, (poly)vinyl esters, (poly)vinyl ethers, polyvinyl alcohols, polyvinylpyrrolidones, celluloses and derivatives of any of these.

In a preferred embodiment of the present invention, the polymer chain of the repeating unit B is a polyethylene glycol.

More preferably, the repeating unit B comprises a chemical structure represented by following chemical formula (X), Chemical formula (X)

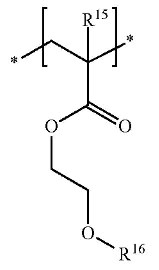

wherein the chemical formula (X), $R^{15}$ is hydrogen atom, or methyl group; $R^{16}$ is alkyl group having 1 to 10 carbon atoms; and n is an integer 1 to 5, "*" represents the connecting point to an another polymer repeating unit or a terminal of the polymer.

Even more preferably, $R^{15}$ can be a hydrogen atom, or methyl group, $R^{16}$ can be an ethyl group, and n is an integer 1 to 5.

In some embodiments of the present invention, the surface of the core, or the outermost surface of one or more shell layers of the semiconducting light emitting nanoparticle can be partly or fully over coated by the polymer. By using ligand exchange method, described in for example, Thomas Nann, Chem. Commun., 2005, 1735-1736, DOI: 10.1039/b-414807j, the polymer can be introduced onto the surface of the core or the outermost surface of the core of the semiconducting light emitting nanoparticle.

According to the present invention, in some embodiments, the content of said polymer is in the range from 1% to 500% by weight, more preferably in the range from 20% to 350% by weight, even more preferably from 50% to 200% by weight with respect to the total weight of the semiconducting light emitting nanoparticle.

In a preferred embodiment of the present invention, the weight average molecular weight (Mw) of the polymer is in the range from 200 g/mol to 30,000 g/mol, preferably from 250 g/mol to 2,000 g/mol, more preferably from 400 g/mol to 1,000 g/mol.

The molecular weight $M_w$ is determined by means of GPC (=gel permeation chromatography) against an internal polystyrene standard.

As the polymer, commercially available wetting and dispersing additives which can be solved in non-polar and/or low polar organic solvent can be used preferably. Such as BYK-111, BYK-LPN6919, BYK-103, BYK-P104, BYK-163 ([trademark], from BYK com.), TERPLUS MD1000 series, such as MD1000, MD1100 ([trademark], from Otsuka Chemical), Poly(ethylene glycol) methyl ether amine (Sigma-Ald 767565 [trademark], from Sigma Aldrich), Polyester bis-MPA dendron, 32 hydroxyl, 1 thiol, (Sigma-Ald 767115 [trademark], from Sigma Aldrich), LIPONOL DA-T/25 (From Lion Specialty Chemicals Co.), Carboxymethyl cellulose (from Polyscience etc.), another wetting and dispersing additives disclosed in for examples, "Marc Thiry et. al., ACSNANO, American Chemical society, Vol. 5, No. 6, pp 4965-4973, 2011", "Kimihiro Susumu, et. al., J. Am. Chem. Soc. 2011, 133, pp 9480-9496".

Thus, in some embodiments of the present invention, the composition comprises at least the (meth)acrylate monomer of chemical formula (I), the (meth)acrylate monomer of chemical formula (II) and the polymer configured so that said polymer enables to the scattering particles to disperse in the composition, wherein the mixing ratio of the (meth) acrylate monomer of chemical formula (I):the (meth)acrylate monomer of chemical formula (II):the polymer is 10:89:1 to 50:40:10, preferably in the range from 15:82:3 to 30:60:10.

In some embodiment of the present invention, a composition comprises, essentially consisting of or consisting of, at least a polymer derived or derivable from the (meth)acrylate monomers of the composition of the present invention.

In a preferred embodiment of the present invention, said polymer is derived or derivable from all the (meth)acrylate monomers in the composition, for example, at least the (meth)acrylate monomer of chemical formula (I) and/or the (meth)acrylate monomer of chemical formula (II).

QY Calculation

Quantum Yield (QY) measurements of composition are carried out by using Absolute PL quantum yield spectrometer C9920-02 (Hamamatsu Photonics K.K.), and following formula is used.

Quantum yield (QY)=emitted photon number from the sample/absorbed photon number of the sample.

In order to enhance out-coupling efficiency from an optical medium comprising the semiconducting light emitting nanoparticle, for example, a quantum sized material containing optical film, several methods are proposed, such as incorporating scattering particles in the film and/or the adjacent films, reduce the refractive index of the film by incorporating hollow silica particles, and placing suitable shape structure (cf. Proceedings of SPIE, P. 184, 5519-33, 2004). Among them, placing the structured film upon the quantum materials containing film is the most suitable for large TV application in which local dimming technique is applied to achieve high dynamic range. The scattering particles are detrimental to the dimming technique, since the scattered light causes a color blur and reducing the refractive index of the film enough for a practical level is difficult because of the limited volume for the hollow silica particles. The combination of reducing the refractive index and placing the structured film can be also applied.

In another aspect, the present invention further relates to cured composition obtained or obtainable from the process of the present invention.

In another aspect, the present invention furthermore relates to a layer obtained or obtainable from the process of the present invention.

In another aspect, the present invention also relates to layer containing light emitting moieties, a matrix material and scattering particles, wherein the total amount of the light emitting moieties is in the range from 0.1 wt. % to 90 wt. % based on the total amount of the layer, more preferably from 10 wt. % to 70 wt. %, even more preferably from 30 wt. % to 50 wt. %; and wherein the total amount of the scattering particles is 10 wt % or less based on the total amount of the layer, preferably it is in the range from 5 to 1 wt %, more preferably it is in the range from 4 to 2 wt %, preferably the layer is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

In a preferable embodiment of the present invention, the layer thickness of the layer is in the range from 1 to 50 um, preferably 5 to 15, more preferably 8 to 15, further more preferably 8-12 um.

In another aspect, the present invention also relates to a color conversion device (100) comprising at least a $1^{st}$ pixel (161) partly or fully filled with the cured composition of claim 16 or filled with the layer of the present invention, and a bank (150) comprising at least a polymer material, preferably the color conversion device (100) further contains a supporting medium (170).

$1^{st}$ Pixel (161)

According to the present invention, said $1^{st}$ pixel (161) comprises at least a matrix material (120) containing a light emitting moiety (110). In a preferable embodiment, the $1^{st}$ pixel (161) is a solid layer obtained or obtainable by curing the composition of the present invention containing at least one acrylate monomer together with at least one light emitting moiety (110), preferably said curing is a photo curing by photo irradiation, thermal curing or a combination of a photo curing and a thermal curing.

In a preferred embodiment, the height of the bank (150) is in the range from 0.1 to 100 μm, preferably it is from 1 to 50 μm, more preferably from 1 to 25 μm, furthermore preferably from 5 to 20 μm.

In some embodiments of the present invention, the layer thickness of the pixel (161) is in the range from 0.1 to 100 μm, preferably it is from 1 to 50 μm, more preferably from 5 to 25 μm.

In some embodiments of the present invention, the color conversion device (100) further contains a $2^{nd}$ pixel (162), preferably the device (100) contains at least said $1^{st}$ pixel (161), $2^{nd}$ pixel (162) and a $3^{rd}$ pixel (163), more preferably said $1^{st}$ pixel (161) is a red color pixel, the $2^{nd}$ pixel (162) is a green color pixel and the $3^{rd}$ pixel (163) is a blue color pixel, even more preferably the $1^{st}$ pixel (161) contains a red light emitting moiety (110R), the $2^{nd}$ color pixel (162) contains a green light emitting moiety (110G) and the $3^{rd}$ pixel (163) does not contain any light emitting moiety.

In some embodiments, at least one pixel (160) additionally comprises at least one light scattering particle (130) in the matrix material (120), preferably the pixel (160) contains a plurality of light scattering particles (130).

In some embodiments of the present invention, said $1^{st}$ pixel (161) consists of one pixel or two or more sub-pixels configured to emit red-color when irradiated by an excitation light, more preferably said sub-pixels contains the same light emitting moiety (110).

In a preferred embodiment, the bank (150) is configured to determine the area of said $1^{st}$ pixel (161) and at least a part of the bank (150) is directly contacting to at least a part of the $1^{st}$ pixel (161), preferably said $2^{nd}$ polymer of the bank (150) is directly contacting to at least a part of the $1^{st}$ polymer of the $1^{st}$ pixel (161).

In a preferred embodiment, said bank (150) is photolithographically patterned and said $1^{st}$ pixel (161) is surrounded by the bank (150), preferably said $1^{st}$ pixel (161), the $2^{nd}$ pixel (162) and the $3^{rd}$ pixel (163) are all surrounded by the photolithographically patterned bank (150).

According to the present invention, a publicly known bank compositions, a publicly known bank fabrication methods like described in WO 2021/018927 A1 can be used preferably.

Matrix Material (120)

In a preferable embodiment, the matrix material (120) contains a (meth)acrylate polymer, preferably it is a methacrylate polymer, an acrylate polymer or a combination of thereof, more preferably it is an acrylate polymer, even more preferably said matrix material (120) is obtained or obtainable from the composition of the present invention containing at least one acrylate monomer, further more preferably said matrix material (120) is obtained or obtainable from the composition of the present invention containing at least one di-acrylate monomer, particularly preferably said matrix material (120) is obtained or obtainable from the composition of the present invention containing at least one di-acrylate monomer and a mono-acrylate monomer, preferably said composition is a photosensitive composition.

Supporting Medium (170)

In some embodiments of the present invention, said supporting medium (170) is a substrate, more preferably it is a transparent substrate.

In general, said substrate such as a transparent substrate can be flexible, semi-rigid or rigid.

Publicly known transparent substrate suitable for optical devices can be used as desired.

Preferably, as a transparent substrate, a transparent polymer substrate, glass substrate, thin glass substrate stacked on a transparent polymer film, transparent metal oxides (for example, oxide silicone, oxide aluminum, oxide titanium), polymer film substrate with transparent metal oxides, can be used. Even more preferably it is a transparent polymer substrate or a glass substrate.

A transparent polymer substrate can be made from polyethylene, ethylene-vinyl acetate copolymer, ethylene-vinyl alcohol copolymer, polypropylene, polystyrene, polymethyl methacrylate, polyvinylchloride, polyvinyl alcohol, polyvinylvutyral, nylon, polyether ether ketone, polysulfone, polyether sulfone, tetrafluoroethylene-erfluoroalkylvinyl ether copolymer, polyvinyl fluoride, tetraflyoroethylene ethylene copolymer, tetrafluoroethylene hexafluoro polymer copolymer, or a combination of any of these.

The term "transparent" means at least around 60% of incident light transmittal at the thickness used in a photovoltaic device and at a wavelength or a range of wavelength used during operation of photovoltaic cells. Preferably, it is over 70%, more preferably, over 75%, the most preferably, it is over 80%.

Use

In another aspect, the present invention relates to use of the color conversion device (100) of the present invention in an optical device (300) containing at least one functional medium (320, 420, 520) configured to modulate a light or configured to emit light.

Optical Device

In another aspect, the invention further relates to an optical device (300, 400, 500) containing at least one color conversion device (100) and a functional medium (320, 420, 520) configured to modulate a light or configured to emit light.

In some embodiments of the present invention, the optical device can be a liquid crystal display device (LCD), Organic Light Emitting Diode (OLED), backlight unit for an optical display, Light Emitting Diode device (LED), Micro Electro Mechanical Systems (here in after "MEMS"), electro wetting display, or an electrophoretic display, a lighting device, and/or a solar cell.

Figure 4:
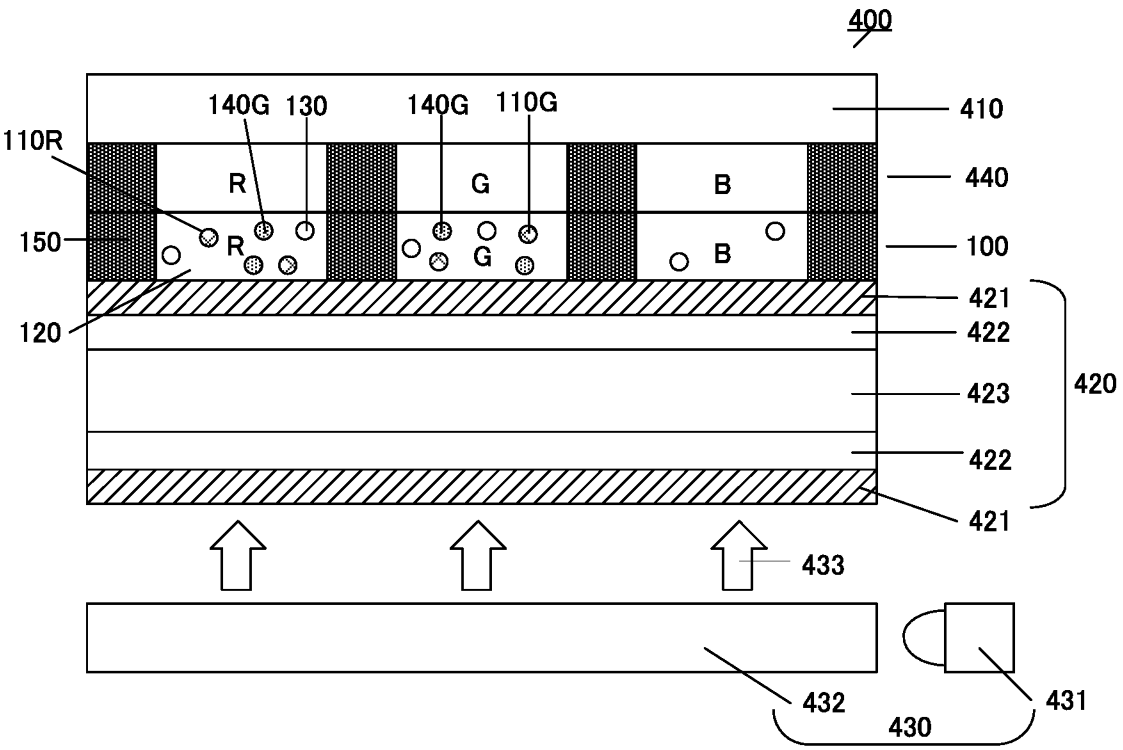
FIG. 4: shows a cross sectional view of a schematic of another embodiment of an optical device (300) of the invention.
Figure 5:
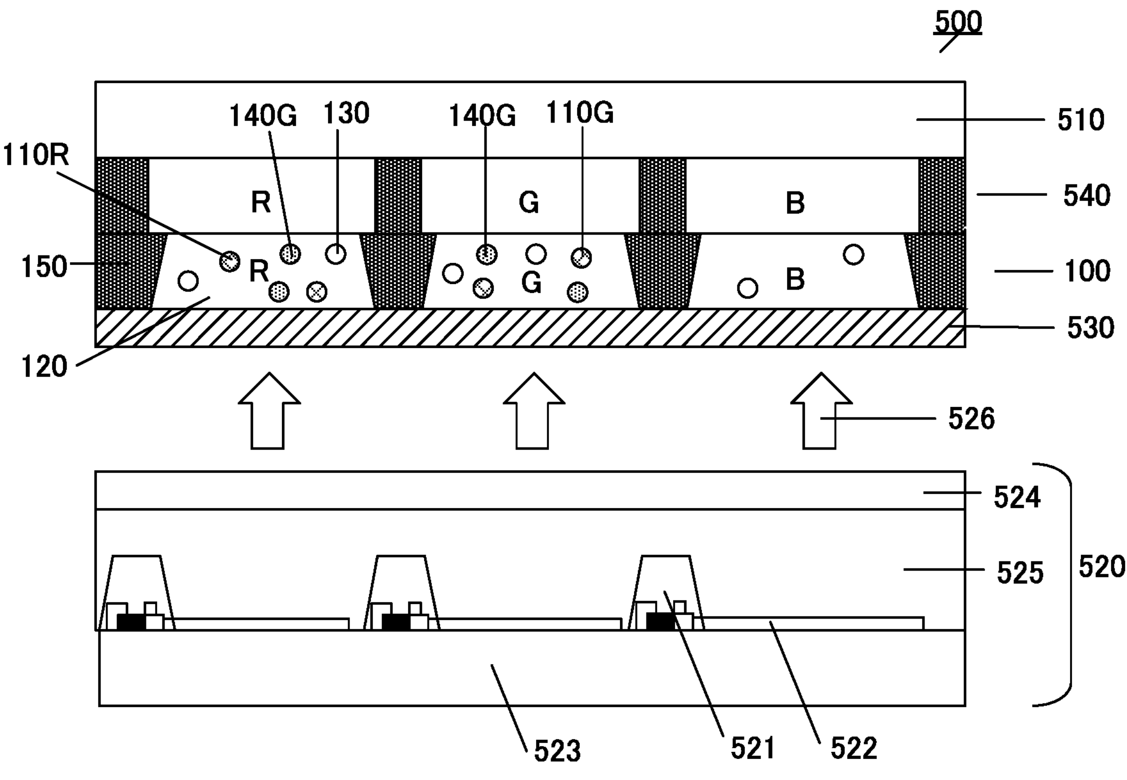
FIG. 5: shows a cross sectional view of a schematic of another embodiment of an optical device (300) of the invention.
Figure 6:
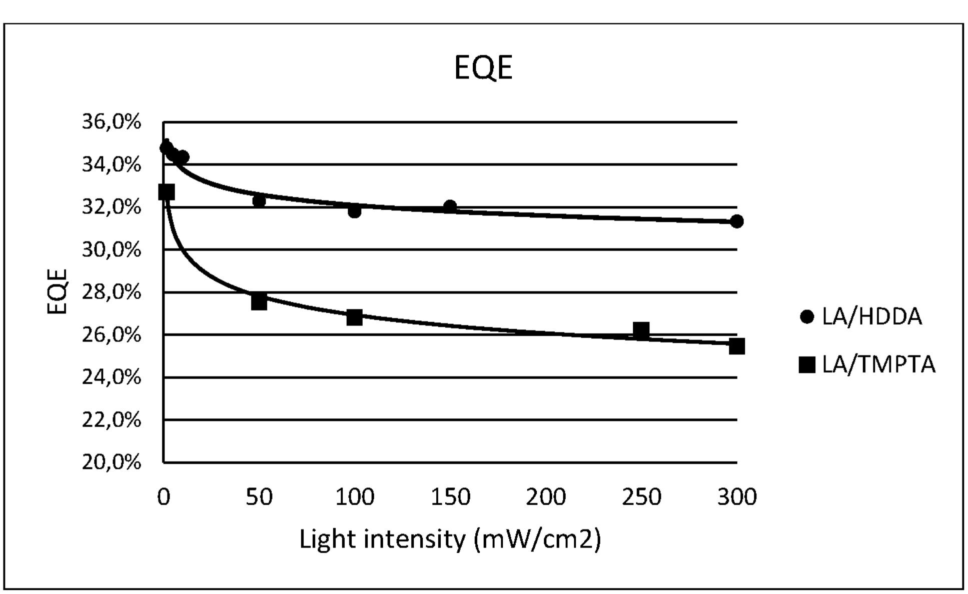
FIG. 6: shows the results of the EQE measurements of working example 12.

FIGS. 4 to 6 show some embodiments of the optical device of the present invention.

Preferable Embodiments

1. Process for fabricating cured composition comprising at least following steps;

a) irradiating a composition with a light as a $1^{st}$ light irradiation;

b) irradiating the composition with a light as a $2^{nd}$ light irradiation;

wherein the composition comprises at least one light emitting moiety and a reactive monomer, preferably said monomer having one or more of functional groups, more preferably it is a (meth)acrylate monomer;

wherein the intensity of the light of the $1^{st}$ light irradiation and the intensity of the light of the $2^{nd}$ light irradiation satisfies the following formula (I).

The intensity of light of the $1^{st}$ light irradiation<the intensity of light of the $2^{nd}$ light irradiation (I)

2. Process of embodiment 1, wherein the peak light wavelength of the light of the $1^{st}$ light irradiation and the peak light wavelength of the light of the $2^{nd}$ light irradiation are, independently of each other, in the range from 200 to 450 nm, preferably from 365 to 410 nm, more preferably from 375 to 405 nm 3. Process of embodiment 1 or 2, wherein the irradiation time of the $1^{st}$ light irradiation at step a) is in the range from 1 second to 500 seconds and the irradiation time of the $2^{nd}$ light irradiation time at step b) is in the range from 1 second to 500 seconds, preferably the irradiation time of the $1^{st}$ light irradiation at step a) is in the range from 2 seconds to 100 seconds and the irradiation time of the $2^{nd}$ light irradiation time at step b) is in the range from 2 seconds to 100 seconds, more preferably the irradiation time of the $1^{st}$ light irradiation at step a) is in the range from 3 seconds to 50 seconds and the irradiation time of the $2^{nd}$ light irradiation time at step b) is in the range from 5 second to 50 seconds, even more preferably more preferably the irradiation time of the $1^{st}$ light irradiation at step a) is in the range from 4 seconds to 20 seconds and the irradiation time of the $2^{nd}$ light irradiation time at step b) is in the range from 7 second to 20 seconds.

4. Process of any one of embodiments 1 to 3, wherein the intensity of light of the $1^{st}$ light irradiation at step (a) is in the range from 0.1 $mW/cm^2$ to 20 $mW/cm^2$ and the intensity of light of the $2^{nd}$ light irradiation at step (b) is in the range from 20 $mW/cm^2$ to 100 $W/cm^2$, preferably the intensity of light of the $1^{st}$ light irradiation at step (a) is in the range from 0.5 $mW/cm^2$ to 10 $mW/cm^2$ and the intensity of light of the $2^{nd}$ light irradiation at step (b) is in the range from 100 $mW/cm^2$ to 10 $W/cm^2$, more preferably the intensity of light of the $1^{st}$ light irradiation at step (a) is in the range from 1 $mW/cm^2$ to 5 $mW/cm^2$ and the intensity of light of the $2^{nd}$ light irradiation at step (b) is in the range from 200 $mW/cm^2$ to 5 $W/cm^2$.
5. Process of any one of embodiments 1 to 4, wherein the composition contains a plurality of light emitting moieties, preferably the total amount of the light emitting moieties is in the range from 0.1 wt. % to 90 wt. % based on the total amount of the composition, more preferably from 10 wt. % to 70 wt. %, even more preferably from 30 wt. % to 50 wt. %.
6. Process of any one of embodiments 1 to 5, wherein the composition comprises scattering particles, wherein the total amount of the scattering particles is 10 wt % or less based on the total amount of the solid contents of the composition, preferably 10 to 0 wt %, more preferably it is in the range from 5 to 1 wt %, even more preferably it is in the range from 4 to 2 wt %.
7. Process of any one of embodiments 1 to 6, the reactive monomer is a (meth)acrylate monomer selected from a mono-(meth)acrylate monomer, a di-(meth)acrylate monomer or a tri-(meth)acrylate monomer more preferably it is a di-methacrylate monomer or a di-acrylate monomer, tri-methacrylate monomer, tri-acrylate monomer even more preferably it is represented by following chemical formula (I), (I)

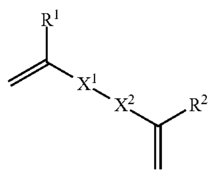

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

preferably the symbol $X^1$ is

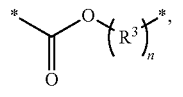

where "*" on the left side of the formula represents the connecting point to the carbon atom of the end group $C{=}CR^1$ of the formula (I) and "*" on the right side represents the connecting point to symbol $X^2$ of the formula (I);

n is 0 or 1;

preferably the symbol $X^2$ is

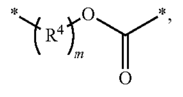

where "*" on the left side of the formula represents the connecting point to symbol X1 of the formula (I) and "*" on the right side represents the connecting point to the end group $C{=}CR^2$ of the formula (I);

m is 0 or 1;

preferably at least m or n is 1;

$R^3$ is a straight alkylene chain or alkoxylene chain having 1 to 25 carbon atoms, a cycloalkane having 3 to 25 carbon atoms or an aryl group having 3 to 25 carbon atoms, preferably $R^3$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^4$ is a straight alkylene chain or alkoxylene chain having 1 to 25 carbon atoms, a cycloalkane having 3 to 25 carbon atoms or an aryl group having 3 to 25 carbon atoms, preferably $R^4$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, C≡C, $Si(R^a)_2$, $Ge(R^a)_2$, $Sn(R^a)_2$, C=O, C=S, C=Se, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

8. Process of any one of embodiments 1 to 7, wherein the composition further comprises an another (meth)acrylate monomer which is different from the (meth)acrylate monomer of chemical formula (I), preferably said another (meth)acrylate monomer is a mono-(meth) acrylate monomer, more preferably it is a mono-methacrylate monomer or mono-acrylate monomer, even more preferably it is represented by following chemical formula (II), (II)

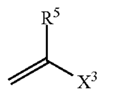

$X^3$ is a non-substituted or substituted alkyl group, aryl group or an alkoxy group;

preferably the symbol $X^3$ is

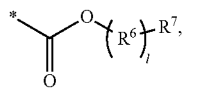

where "*" on the left side of the formula represents the connecting point to the end group $C{=}CR^5$ of the formula (I);

I is 0 or 1;

$R^5$ is a hydrogen atom, halogen atom of Cl, Br, or F, methyl group, alkyl group, aryl group, alkoxy group, ester group, or a carboxylic acid group;

$R^6$ is a straight alkylene chain or alkoxylene chain having 1 to 25 carbon atoms, preferably $R^6$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^7$ is a straight alkylene chain or alkoxylene chain having 1 to 25 carbon atoms, preferably $R^7$ is a straight alkylene chain or alkoxylene chain having 1 to 15 carbon atoms, more preferably 1 to 5 carbon atoms, which may be substituted by one or more radicals $R^a$, where one or more non-adjacent $CH_2$ groups may be replaced by $R^aC{=}CR^a$, $C{\equiv}C$, $Si(R^a)_2$, $Ge(R^a)_2$, $Sn(R^a)_2$, $C{=}O$, $C{=}S$, $C{=}Se$, $C{=}NR^a$, $P({=}O)(R^a)$, SO, SO2, $NR^a$, OS, or $CONR^a$ and where one or more H atoms may be replaced by D, F, Cl, Br, I, CN or $NO_2$;

$R^a$ is at each occurrence, identically or differently, H, D or an alkyl group having 1 to 20 carbon atoms, cyclic alkyl or alkoxy group having 3 to 40 carbon atoms, an aromatic ring system having 5 to 60 carbon ring atoms, or a hetero aromatic ring system having 5 to 60 carbon atoms, wherein H atoms may be replaced by D, F, Cl, Br, I; two or more adjacent substituents $R^a$ here may also form a mono- or polycyclic, aliphatic, aromatic or heteroaromatic ring system with one another.

9. Process of any one of embodiments 1 to 8, wherein the (meth)acrylate monomer of chemical formula (II) is in the composition and the mixing ratio of the (meth) acrylate monomer of chemical formula (I) to the (meth) acrylate monomer of chemical formula (II) is in the range from 1:99 to 99:1 (formula (I):formula (II)), preferably from 5:95 to 50:50, more preferably from 10:90 to 40:60, even more preferably it is from 15:85 to 25:75, preferably at least a purified (meth)acrylate monomer represented by chemical formula (I), (II) is used in the composition, more preferably the (meth) acrylate monomer of chemical formula (I) and the (meth)acrylate monomer of chemical formula (II) are both obtained or obtainable by a purification method.

10. Process of any one of embodiments 1 to 9, wherein the boiling point (B.P.) of said (meth)acrylate monomer of chemical formula (I) and/or chemical formula (II) is 250° C. or more, preferably the (meth)acrylate monomers of chemical formula (I) and chemical formula (II) are both 250° C. or more, more preferably it is in the range from 250° C. to 350° C., even more preferably from 280° C. to 350° C., further more preferably from 300° C. to 348° C.

11. Process of any one of embodiments 1 to 10, wherein the viscosity of the composition is 35 cP or less at room temperature, preferably in the range from 1 to 35 cP, more preferably from 2 to 30 cP, even more preferably from 10 to 28 cP.

12. Process of any one of embodiments 1 to 11, wherein said light emitting moiety comprises a ligand, more preferably said light emitting moiety comprises an alkyl or alkenyl type ligand having carbon atoms 2 to 20.

13. Process of any one of embodiments 1 to 12, wherein said light emitting moiety is an organic light emitting material and/or an inorganic light emitting material, preferably said organic light emitting materials is an organic dye, or an organic light emitting material for organic light emitting diode device, preferably said inorganic light emitting material is an inorganic phosphor and/or a quantum material.

14. Process of any one of embodiments 1 to 13, wherein the composition further comprises an additional material selected from one or more members of the group consisting of;

A) another light emitting moiety, which is different from the light emitting moiety of claim 1, preferably said light emitting moiety is an organic light emitting material and/or an inorganic light emitting material, more preferably said organic light emitting materials is an organic dye, or an organic light emitting material for organic light emitting diode device, more preferably said inorganic light emitting material is an inorganic phosphor and/or a quantum material, preferably said light emitting moiety comprises a ligand, more preferably said light emitting moiety comprises an alkyl or alkenyl type ligand having carbon atoms 2 to 25;

B) another (meth)acrylate monomer; and

C) optically transparent polymers, anti-oxidants, radical quenchers, photo initiators and/or surfactants.

15. Process of any one of embodiments 1 to 14, wherein the composition comprises a solvent 10 wt % or less based on the total amount of the composition, more preferably it is 5 wt % or less, more preferably it is a solvent free composition, preferably the composition does not comprise any one of the following solvent selected from one or more members of the group consisting of ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; propylene glycol monoalkyl ethers, such as, propylene glycol monomethyl ether (PGME), propylene glycol monoethyl ether, and propylene glycol monopropyl ether; ethylene glycol alkyl ether acetates, such as, methyl cellosolve acetate and ethyl cellosolve acetate; propylene glycol alkyl ether acetates, such as, propylene glycol monomethyl ether acetate (PGMEA), propylene glycol monoethyl ether acetate, and propylene glycol monopropyl ether acetate; ketones, such as, methyl ethyl ketone, acetone, methyl amyl ketone, methyl isobutyl ketone, and cyclohexanone; alcohols, such as, ethanol, propanol, butanol, hexanol, cyclo hexanol, ethylene glycol, triethylene glycol and glycerin; esters, such as, ethyl 3-ethoxypropionate, methyl 3-methoxypropionate and ethyl lactate; and cyclic asters, such as, gamma-butyro-lactone; chlorinated hydrocarbons, such as chloroform, dichloromethane, chlorobenzene, trimethyl benzenes such as 1,3,5-trimethylbenzene, 1,2,4-trimethyl benzene, 1,2,3-trimethyl benzene, docecyl benzene, cyclohexylbenzene, 1,2,3,4-tetramethylbenzene, 1,2,3,5-tetramethylbenzene, 3-isopropylbiphenyl, 3-methylbiphenyl, 4-methylbiphenyl and dichlorobenzene, preferably said solvent is propylene glycol alkyl ether acetates, alkyl acetates, ethylene glycol mono-alkyl ethers, propylene glycol, and propylene glycol mono-alkyl ethers.

16. A cured composition obtained or obtainable from the process of any one of embodiments 1 to 15.

17. A layer obtained or obtainable from the process of any one of embodiments 1 to 15.

18. A layer containing light emitting moieties, a matrix material and scattering particles, wherein the total amount of the light emitting moieties is in the range from 0.1 wt. % to 90 wt. % based on the total amount of the layer, more preferably from 10 wt. % to 70 wt. %, even more preferably from 30 wt. % to 50 wt. %; and wherein the total amount of the scattering particles is 10 wt % or less based on the total amount of the layer, preferably it is in the range from 5 to 1 wt %, more preferably it is in the range from 4 to 2 wt %, preferably the layer is configured to achieve the EQE value 20% or more, more preferably said EQE value is in the range from 20% to 99%, more preferably said EQE value is in the range from 30% to 50%, even more preferably said EQE value is in the range from 30% to 40%, for blue-to-green conversion efficiency, preferably the layer is a patterned layer, preferably said layer being a patterned layer.

19. The later of embodiment 17 or 18, wherein the layer thickness of the layer is in the range from 1 to 50 um, preferably 5 to 15, more preferably 8 to 15, further more preferably 8-12 um.

20. A color conversion device (100) comprising at least a 1$^{st}$ pixel (161) partly or fully filled with the cured composition of embodiment 16 or filled with the layer of any one of embodiments 17 to 19, and a bank (150) comprising at least a polymer material, preferably the color conversion device (100) further contains a supporting medium (170).

21. The device (100) of embodiment 20, wherein the height of the bank (150) is in the range from 0.1 to 100 μm, preferably it is from 1 to 50 μm, more preferably from 1 to 25 μm, furthermore preferably from 5 to 20 μm.

22. The device (100) of embodiment 20 or 21, wherein the layer thickness of the pixel (161) is in the range from 0.1 to 100 μm, preferably it is from 1 to 50 μm, more preferably from 5 to 25 μm.

23. The device (100) of any one of embodiments 20 to 22, further contains a 2$^{nd}$ pixel (162), preferably the device (100) contains at least said 1$^{st}$ pixel (161), 2$^{nd}$ pixel (162) and a 3$^{rd}$ pixel (163), more preferably said 1$^{st}$ pixel (161) is a red color pixel, the 2$^{nd}$ pixel (162) is a green color pixel and the 3$^{rd}$ pixel (163) is a blue color pixel, even more preferably the 1$^{st}$ pixel (161) contains a red light emitting moiety (110R), the 2$^{nd}$ color pixel (162) contains a green light emitting moiety (110G) and the 3$^{rd}$ pixel (163) does not contain any light emitting moiety.

24. The device (100) of any one of embodiments 20 to 23 wherein at least one pixel (160) additionally comprises at least one light scattering particle (130) in the matrix material (120), preferably the pixel (160) contains a plurality of light scattering particles (130).

25. The device (100) of any one of embodiments 20 to 24, wherein said 1$^{st}$ pixel (161) consists of one pixel or two or more sub-pixels configured to emit red-color when irradiated by an excitation light, more preferably said sub-pixels contains the same light emitting moiety (110).

26. The device (100) of any one of embodiments 20 to 25, wherein the bank (150) is configured to determine the area of said 1$^{st}$ pixel (161) and at least a part of the bank (150) is directly contacting to at least a part of the 1$^{st}$ pixel (161), preferably said 2$^{nd}$ polymer of the bank (150) is directly contacting to at least a part of the 1$^{st}$ polymer of the 1$^{st}$ pixel (161).

27. The device (100) of any one of embodiments 20 to 26, wherein said bank (150) is photolithographically patterned and said 1$^{st}$ pixel (161) is surrounded by the bank (150), preferably said 1$^{st}$ pixel (161), the 2$^{nd}$ pixel (162) and the 3$^{rd}$ pixel (163) are all surrounded by the photolithographically patterned bank (150).

28. Use of the color conversion device (100) of any one of embodiments 20 to 27 in an optical device (300) containing at least one functional medium (320, 420, 520) configured to modulate a light or configured to emit light.

29. An optical device (300) containing at least one functional medium (320, 420, 520) configured to modulate a light or configured to emit light, and the color conversion device (100) of any one of embodiments 20 to 28.

Technical Effect of the Invention

Providing a QD ink with less or without TiO2 or scattering particles in general which would therefore provide more flexibility for the ink design and selection and concentration of the other ink components.

The benefit of this invention is achieving higher EQE and lower BL for a QD ink without scattering particles or less amount of scattering particles compared to a reference ink, achieving higher haze value of a cured QD ink without scattering particles or less amount of scattering particles compared to a reference ink, and achieving higher haze value of a cured QD ink without scattering particles or less amount of scattering particles compared to a reference ink and higher EQE at the same time possibly realizing lower blue leakage at the same time.

A new process for fabricating cured composition with higher EQE, lower blue leakage, shorter process time, improved haze value after curing, improved curing to polymerize composition and/or realizing lower viscosity of the composition.

Finding best amount of light emitting moieties and scattering particles in the composition to archive lower viscosity, higher EQE, lower blue leakage, good ink jet ability of the composition.

The working examples 1-15 below provide descriptions of the present invention, as well as an in-detail description of their fabrication.

WORKING EXAMPLES

Working Example 1: Preparation of Monomer Mixtures 1,6-Hexanediol diacrylate (HDDA) is purified by passed through molecular sieve prior to use. 2 g of HDDA and 8 g of Lauryl acrylate (LA, viscosity: 4.0 cP, BP: 313.2° C.) are mixed in glass vial, thus obtained a monomer mixture. The weight ratio of HDDA:LA in the monomer mixture is 20:80.

Working Example 2: Preparation of QD Ink

QD ink A is prepared by mixing the following materials.

| | |
|---|---|
| Green QD (Merck) | 45.0 wt. % |
| LA + HDDA (LA:HDDA = 80:20) | 53.5 wt. % |
| Titanium dioxide (scattering particles) | 0 wt. % |
| Phosphine oxide, phenylbis(2,4,6-trimethylbenzoyl) (Omnirad(™) 819) | 1.0 wt % |
| Irganox(™) 1010 | 0.5 wt % |

Working Example 3: Preparation of QD Ink

QD ink B is prepared by mixing the following materials.

| | |
|---|---|
| Green QD (Merck) | 45.0 wt. % |
| LA + HDDA (LA:HDDA = 80:20) | 50.5 wt. % |
| Titanium dioxide (scattering particles) | 3.0 wt. % |
| Phosphine oxide, phenylbis(2,4,6-trimethylbenzoyl) (Omnirad(™) 819) | 1.0 wt % |
| Irganox(™) 1010 | 0.5 wt % |

Working Example 4: Fabrication of QD Test Cells

QD ink A obtained in working example 2 is injected into 6 test cells with 10 mm gap.

Then the obtained 6 test cells containing QD ink A is cured by applying UV light irradiation with different curing time conditions each other to make a cured ink in the test cell.

UV intensity: $1^{st}$ irradiation step: 1.7 mW/cm$^2$ $2^{nd}$ light irradiation step: 300 mW/cm$^2$ Light source: 395 nm LED (peak light wavelength: 395 nm)

Under $N_2$ condition ($O_2$: 0.1%)

Curing Time:

| Cell number | $1^{st}$ step | $2^{nd}$ step | Remarks |
|---|---|---|---|
| 1 | — | 10 sec | [ref1] only high intensity curing |
| 2 | 3 sec | | |
| 3 | 5 sec | | |
| 4 | 10 sec | | |
| 5 | 20 sec | | |
| 6 | 1176 sec | — | [ref2] only low intensity curing |

Test cells 1 to 6 are obtained.

Working Example 5: Fabrication of QD Test Cells

Test cell B is fabricated in the same manner as described in working example 3 except for QD ink B obtained in working example 3 is used instead of QD ink A.

Curing Time:

| Cell number | $1^{st}$ step | $2^{nd}$ step | Remarks |
|---|---|---|---|
| 7 | — | 10 sec | [ref1] only high intensity curing |
| 8 | 3 sec | | |
| 9 | 5 sec | | |
| 10 | 10 sec | | |
| 11 | 20 sec | | |
| 12 | 1176 sec | — | [ref2] only low intensity curing |

Test cells 7 to 12 are obtained.

Working Example 6: EQE Measurement and Blue Leakage Measurement

EQE measurement is carried out by using integrating sphere equipped with excitation light by optical fiber (CWL: 450 nm) and spectrometer (USB4000, Ocean Optics). To detect the photons of the excitation light, air is used as a reference at room temperature.

The number of photons of light emission from the cell towards the integrating sphere is counted by the spectrometer at room temperature.

EQE is calculated by the following calculation Method.

EQE=Photons [Emission light]/Photons [Excitation light]

Wavelength Range for Calculation

Excitation: 430 nm-470 nm

Emission: [Green] 480 nm-600 nm, [Red] 560 nm-680 nm

Blue Leakage measurement is carried out by using integrating sphere equipped with excitation light by optical fiber (CWL: 450 nm) and spectrometer (USB4000, Ocean Optics). To detect the photons of the excitation light, air is used as a reference at room temperature.

The number of photons of light emission from the cell towards the integrating sphere is counted by the spectrometer at room temperature.

Blue Leakage is calculated by the following calculation Method.

BL=Photons [No-Absorbed Excitation light]/Photons [Excitation light]

Wavelength Range for Calculation

Excitation: 430 nm-470 nm

Table 1 shows the results of the EQE measurements and blue leakage (BL) measurements of the test cells obtained in working example 4 and 5.

TABLE 1

| Cell | NoTiO2 (QD ink A) | | Cell | with TiO2 (QD ink B) | |
|---|---|---|---|---|---|
| Number | BL | EQE | Number | BL | EQE |
| 1 | 16.3% | 29.7% | 7 | 10.6% | 31.4% |
| 2 | 17.4% | 31.8% | 8 | 11.1% | 33.9% |
| 3 | 17.2% | 31.8% | 9 | 11.2% | 34.1% |
| 4 | 17.1% | 32.0% | 10 | 11.1% | 34.5% |
| 5 | 16.6% | 32.2% | 11 | 11.2% | 34.4% |
| 6 | 16.1% | 32.3% | 12 | 11.8% | 33.7% |

By applying the 2 step curing process of the invention, improved EQE, short production time, educed blue leakage value are archived at the same time.

From the view point of realizing higher EQE, irradiating composition with light having lower light intensity until the composition polymerized is suitable. Preferably, total energy of light irradiation is around 2-3 J/cm$^2$.

Working Example 7: Fabrication of QD Test Cells and Haze Measurements

For haze value measurements, with the same condition as described in working example 2 and 4, 4 test cells (QD45-1, QD45-2, QD45-3, QD45-4) are fabricated.

Then, 4 test cells (QD45-SB-1, QD45-SB-2, QD45-SB-3, QD45-SB-4) are also fabricated in the same manner as described in working example 3 and 4.

Further, 4 test cells (QD50-1, QD50-2, QD50-3, QD50-4) are fabricated in the same manner as described in working example 2 and 4 except for that the 50 wt % of Green QD (Merck) are used instead of 45 wt %.

Finally, 4 test cells (QD50-SB-1, QD50-SB-2, QD50-SB-3, QD50-SB-4) are fabricated in the same manner as described in working example 3 and 4 except for that the 50 wt % of Green QD (Merck) are used instead of using 45 wt % of Green QD.

Then, these obtained test cells are cured by irradiating it with the following condition.

Light source: 395 nm LED (peak light wavelength: 395 nm)

Under $N_2$ condition ($O_2$: 0.1%)

UV intensity: 1.7 mW/cm$^2$ for samples 1 and samples 2 (QD45-1, QD45-2, QD45-SB-1, QD45-SB-2, QD50-1, QD50-2, QD50-SB-1 and QD50-SB-2)

300 mW/cm$^2$ for samples 3 and samples 4 (QD45-3, QD45-4, QD45-SB-3, QD45-SB-4, QD50-3, QD50-4, QD50-SB-3 and QD50-SB-4)

Note: It is not the "2 step curing process".

Haze value is measured before and after light curing of the test samples using a photo spectrometer (Shimadzu, UV-2550) fitted with an integration sphere detector at room temperature in air condition, and a test cell containing the composition as a 10 μm thick layer (in liquid state or in cured solid state) sandwiched between two 0.7 mm thick AF glasses is fitted in the beam path in front of the integration sphere, then the measurement is performed by the following steps T1 to T4 in this sequence in the wavelength range of 380-780 nm:

(T1) all the light emitted from the light source of the photo spectrometer is collected by the integration sphere which is closed with a white reflector to measure it by the photo spectrometer, said test cell is not in the beam path in front of the integration sphere;

(T2) the incident light first passes through the sample before being collected in the closed integration sphere to measure all the light passing through the sample, said test cell is placed in the beam path in front of the integration sphere;

(T3) the incident light is allowed to pass through the open integration sphere to determine the amount of scattered light, said test cell is not in the beam path of the integration sphere;

(T4) light passes first through the sample and is then collected by the opened integration sphere, said test cell is placed in the beam path in front of the integration sphere; the amount of light scattered by the sample is determined in this configuration;

then, said haze value is calculated using the following equation:

$$\text{Haze value}=((T4/T2)-(T3/T1))*100\ [\%].$$

Table 2-7 shows the results of the haze measurements of the test cells obtained in working example 7.

TABLE 2

| | Haze at 537 nm | | | | | |
|---|---|---|---|---|---|---|
| | 1.7 mW-1 | 1.7 mW-2 | 300 mW-3 | 300 mW-4 | Before | Before |
| QD45 | 86.30 | 86.30 | 68.08 | 68.71 | 1.66 | 1.67 |
| QD45-SB | 92.90 | 93.97 | 88.72 | 89.74 | 69.34 | 69.18 |
| QD50 | 89.33 | 89.13 | 68.55 | 66.37 | 1.84 | 2.06 |
| QD50-SB | 92.68 | 92.26 | 87.70 | 86.10 | 44.36 | 49.89 |

Here in the table for example, 1.7 mW-1 means the light intensity of light irradiated to the samples 1 (QD45-1 and QD45-SB-1) and 1.7 mW-2 means light intensity of light irradiated to the samples 2 (QD45-1 and QD45-SB-1).

TABLE 3

| | Ave. | | |
|---|---|---|---|
| | cured at 1.7 mW | cured at 300 mW | Before curing |
| QD45 | 86.30 | 68.39 | 1.67 |
| QD45-SB | 93.43 | 89.23 | 69.26 |
| QD50 | 89.23 | 67.46 | 1.96 |
| QD50-SB | 92.47 | 86.90 | 47.12 |

TABLE 4

| | Ratio = Haze value of after curing/haze value of before curing | |
|---|---|---|
| | cured at 1.7 mW | cured at 300 mW |
| QD45 | 51.82 | 41.07 |
| QD45-SB | 1.35 | 1.29 |
| QD50 | 45.85 | 34.66 |
| QD50-SB | 1.96 | 1.84 |

TABLE 5

| | Haze at 450 nm | | | | | |
|---|---|---|---|---|---|---|
| | 1.7 mW-1 | 1.7 mW-2 | 300 mW-1 | 300 mW-2 | Before-1 | Before-2 |
| QD45 | 97.27 | 96.61 | 88.92 | 90.16 | 5.50 | 5.19 |
| QD45-SB | 98.17 | 96.83 | 96.16 | 96.61 | 80.35 | 81.10 |
| QD50 | 95.06 | 95.94 | 90.36 | 90.36 | 6.08 | 6.15 |
| QD50-SB | 98.63 | 96.61 | 97.05 | 95.50 | 51.05 | 57.02 |

TABLE 6

| | Ave. | | |
|---|---|---|---|
| | cured at 1.7 mW | cured at 300 mW | Before curing |
| QD45 | 96.94 | 89.54 | 5.34 |
| QD45-SB | 97.50 | 96.38 | 80.72 |
| QD50 | 95.50 | 90.36 | 6.12 |
| QD50-SB | 97.62 | 96.28 | 54.03 |

TABLE 7

| | Ratio = Haze value of after curing/haze value of before curing | |
|---|---|---|
| | cured at 1.7 mW | cured at 300 mW |
| QD45 | 18.15 | 16.76 |
| QD45-SB | 1.21 | 1.19 |
| QD50 | 15.61 | 14.77 |
| QD50-SB | 1.81 | 1.78 |

Working Example 8: Fabrication of QD Test Cells

Test cells, QD45 and QD50 are fabricated in the same manner as described in working example 2 and 4 except for that QD ink with 45 wt. % and 50 wt. % QDs are used and test cells with 10 mm gap are used for fabrication.

Then obtained test cells are cured with different light irradiation conditions.

Light source: 395 nm LED (peak light wavelength: 395 nm)

Under $N_2$ condition ($O_2$: 0.1%)

UV intensity: 1.7, 10, 50, 150 and 300 mW/cm2

Working Example 9: EQE Measurement and Blue Leakage Measurement

EQE measurements and blue leakage measurements are performed in the same manner as described in working example 6 except for that the test cells obtained in working example 8 are used.

TABLE 8

| | BL | | EQE | |
|---|---|---|---|---|
| mW/cm$^2$ | QD45 | QD50 | QD45 | QD50 |
| 1.7 | 16.1% | 15.2% | 32.3% | 33.0% |
| 10 | 16.7% | 15.8% | 31.8% | 32.4% |
| 50 | 16.5% | 14.3% | 30.4% | 31.9% |
| 150 | 16.4% | 14.3% | 29.9% | 31.0% |
| 300 | 16.3% | 14.2% | 29.7% | 30.5% |

Working Example 10: Fabrication of QD Test Cells

QD ink C is prepared by mixing the following materials.

| | |
|---|---|
| Green QD (Merck) | 40.0 wt. % |
| Oleic acid | 2.0 wt. % |
| LA + HDDA (LA:HDDA = 80:20) | 56.5 wt. % |
| Titanium dioxide (scattering particles) | 0 wt. % |
| Phosphine oxide, phenylbis(2,4,6-trimethylbenzoyl) (Omnirad(TM) 819) | 1.0 wt % |
| Irganox(TM) 1010 | 0.5 wt % |

QD ink C obtained in working example 10 is injected into 7 test cells with 15 mm gap.

Then, the test cells are each independently cured different curing conditions as described below.

Experimental Condition

Test Sample: 15 um test cell

Curing Condition:

UV dose fixed to 900 mJ/cm$^2$

Under $N_2$ flow (0.2% $O_2$)

| Light Intensity (mW/cm$^2$) | Irradiation Time (sec) |
|---|---|
| 300 | 3 |
| 150 | 6 |
| 100 | 9 |
| 50 | 18 |
| 10 | 90 |
| 5 | 180 |
| 1.7 | 530 |

Working Example 11: Fabrication of QD Test Cells

QD ink D is prepared in the same manner as described in working example 10 except for that the monomer mixture LA+TMPTA (LA:TMPTA=90:10) is used instead of the monomer mixture LA+HDDA (LA:HDDA=80:20).

Then, QD ink D obtained in working example 11 is injected into 7 test cells with 15 mm gap.

Then, the test cells are each independently cured in the same manner as described in working example 10.

Working Example 12: EQE Measurement and Blue Leakage Measurement

EQE measurement and blue leakage measurement of the test cells obtained in working examples 10 and 11 are performed in the same manner as described in working example 6 except for that the test cells obtained in working examples 10 and 11 are used.

Figure 7:
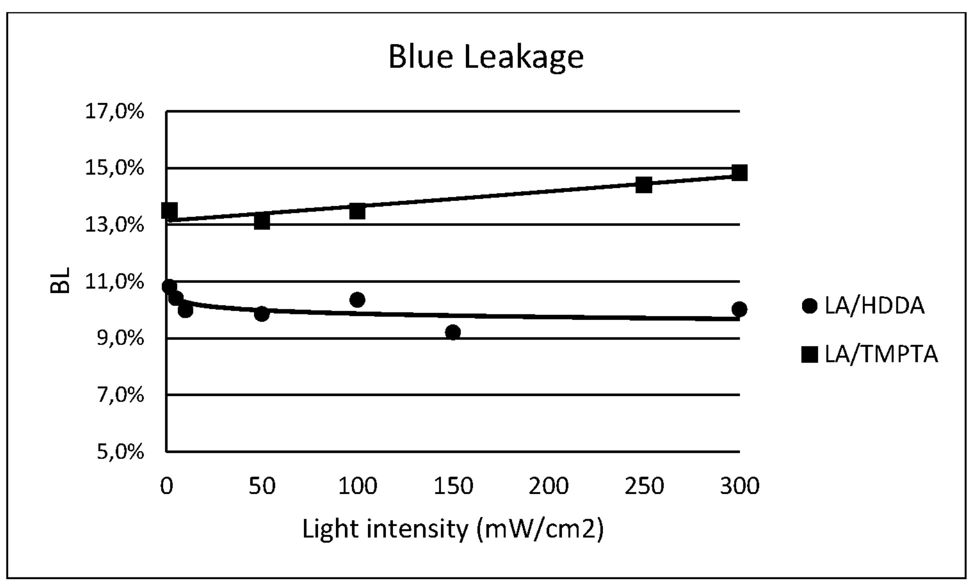
FIG. 7: shows the results of the blue leakage measurements of working example 12.

FIGS. 6 and 7 show the results of the measurements.

As described in FIG. 6, around 5% higher EQE value is obtained with using QD ink C than the EQE value obtained with using QD ink D if it is cured by 300 mW/cm$^2$ light irradiation.

As shown in FIG. 7, around 8% reduced blue leakage is observed with using QD ink C than the blue leakage obtained with using QD ink D if it is cured by 300 mW/cm$^2$ light irradiation.

Working Example 13: QD Ink and Test Cell Fabrication

QD loading: 40, 45, 50 wt. %

Titanium dioxide (scattering particles): 1, 3, 5, 7 wt. %

Working Example 14: EQE Measurement and Blue Leakage Measurement

EQE measurement of the test cells are performed in the same manner as described in working example 6 except for that the test cells obtained in working examples 13 are used.

Figure 8:
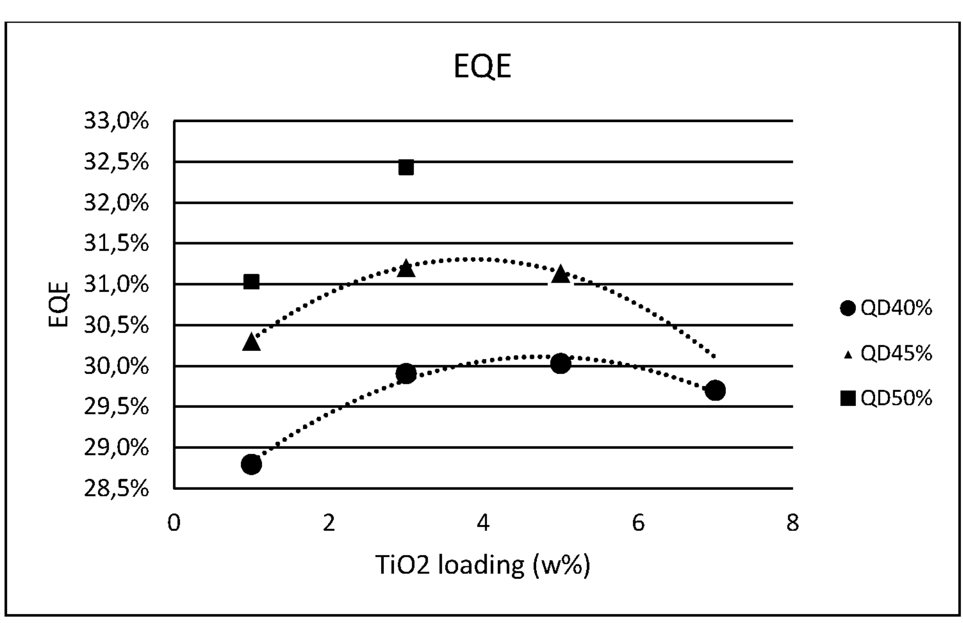
FIG. 8: shows the results of the EQE measurements of working example 14.
Figure 9:
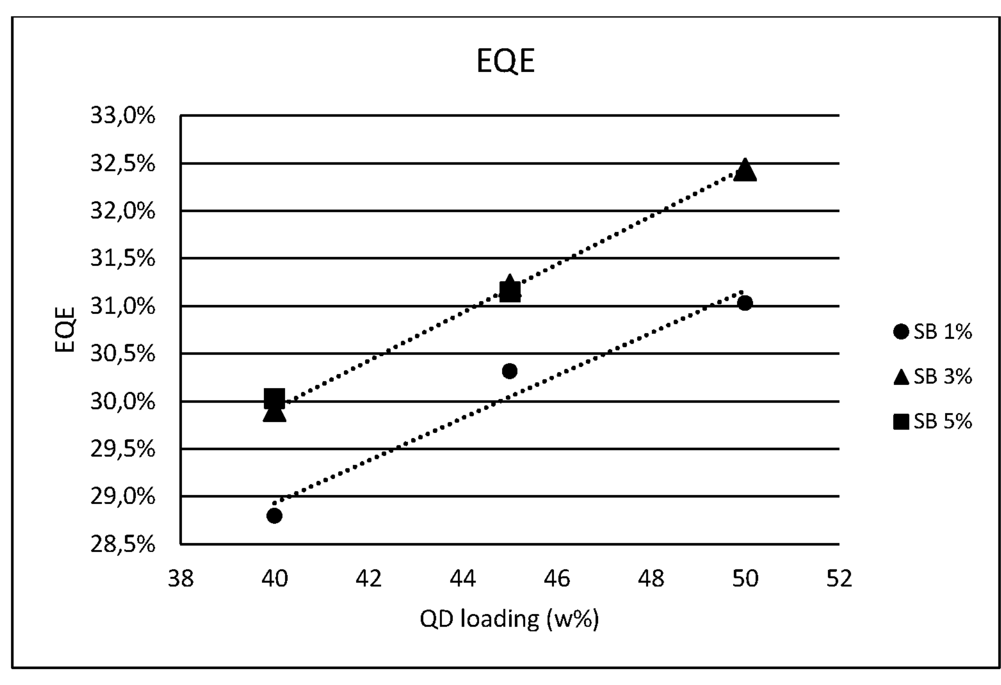
FIG. 9: shows the results of the EQE measurements of working example 14.

FIGS. 8 and 9 show the results of the measurements.

As shown in the FIG. 8, $TiO_2$ loading 3 wt. % shows the best EQE value.

Working Example 15: Viscosity Measurement

Figure 10:
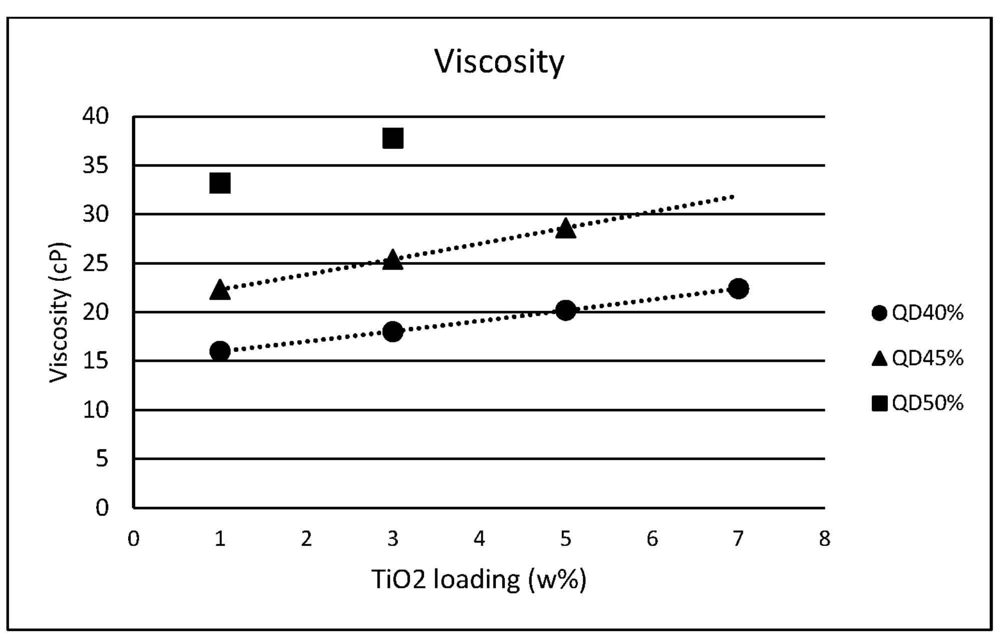
FIG. 10: shows the results of the viscosity measurements of working example 15
Figure 11:
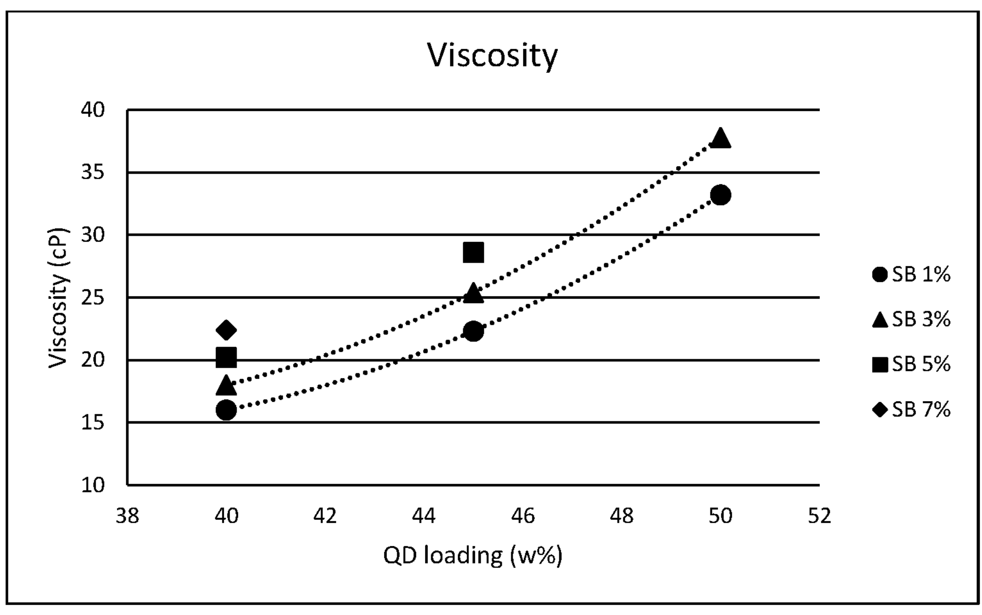
FIG. 11: shows the results of the viscosity measurements of working example 15.

Viscosity of the QD inks obtained in working example 13 are measured by vibration type viscometer VM-10A (SEKONIC) at room temperature. https://www.sekonic.co.jp/english/product/viscometer/vm/vm_series.html FIGS. 10 and 11 show the results of the measurements.

From the view point of viscosity of the QD ink composition, EQE value and blue leakage, $TiO_2$ loading 3 wt. % and QD loading 45 wt. % is the most suitable combination for the QD ink.

The invention claimed is:

1. A process for fabricating cured composition comprising at least following steps;

a) irradiating a composition with a light as a first light irradiation; and b) irradiating the composition with a light as a second light irradiation;

wherein the composition comprises at least one light emitting moiety and a reactive monomer, wherein an intensity of the light of the first light irradiation and an intensity of the light of the second light irradiation satisfies the following formula (I):

the intensity of the light of the first light irradiation<the intensity of the light of the second light irradiation (I), wherein the composition further comprises a quantum dot (QD) material, wherein the intensity of the light of the first light irradiation at step (a) is in a range from 0.1 $mW/cm^2$ to 20 $mW/cm^2$ and the intensity of the light of the second light irradiation at step (b) is in a range from 200 $mW/cm^2$ to 5 $W/cm^2$, and wherein an irradiation time of the first light irradiation at step a) is in a range from 1 second to 500 seconds and an irradiation time of the second light irradiation at step b) is in a range from 1 second to 500 seconds.

2. The process of claim 1, wherein a peak light wavelength of the light of the first light irradiation and a peak light wavelength of the light of the second light irradiation are, independently of each other, in a range from 200 to 450 nm.

3. The process of claim 1, wherein the irradiation time of the first light irradiation at step a) is in a range from 2 seconds to 100 seconds and the irradiation time of the second light irradiation at step b) is in a range from 2 seconds to 100 seconds.

4. The process of claim 1, wherein the composition contains a plurality of light emitting moieties.

5. The process of claim 1, wherein the composition comprises scattering particles, wherein a total amount of the scattering particles is 10 wt % or less based on a total amount of solid contents of the composition.

6. The process of claim 1, wherein the reactive monomer is a (meth)acrylate monomer selected from a mono-(meth)acrylate monomer, a di-(meth)acrylate monomer or a tri-(meth)acrylate monomer.

7. The process of claim 6, wherein the composition further comprises an another (meth)acrylate monomer, which is different from the (meth)acrylate monomer of claim 6.

8. The process of claim 6, wherein the (meth)acrylate monomer of chemical formula (II) is in the composition and a mixing ratio of the (meth)acrylate monomer of claim 7 represented by chemical formula (I) to the (meth)acrylate monomer of chemical formula (II) is in a range from 1:99 to 99:1 (formula (I):formula (II)),

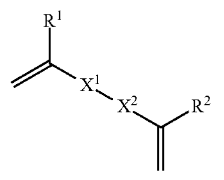

(I)

wherein $X^1$ is a non-substituted or substituted alkyl group, aryl group or an alkoxy group or an ester group;

$X^2$ is a non-substituted or substituted alkyl group, aryl group or an alkoxy group or an ester group;

$R^1$ is a hydrogen atom, halogen atom of Cl, Br, or F, methyl group, alkyl group, aryl group, alkoxy group, ester group, or a carboxylic acid group;

$R^2$ is a hydrogen atom, halogen atom of Cl, Br, or F, methyl group, alkyl group, aryl group, alkoxy group, ester group, or a carboxylic acid group;

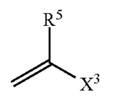

(II)

$X^3$ is a non-substituted or substituted alkyl group, aryl group or an alkoxy group;

$R^5$ is a hydrogen atom, halogen atom of Cl, Br, or F, methyl group, alkyl group, aryl group, alkoxy group, ester group, or a carboxylic acid group.

9. The process of claim 1, wherein a boiling point (B.P.) of the (meth)acrylate monomer of chemical formula (I) and/or chemical formula (II) is 250° C. or more.

10. The process of claim 1, wherein a viscosity of the composition is 35 cP or less at room temperature.

11. The process of claim 1, wherein the light emitting moiety is an organic light emitting material and/or an inorganic light emitting material.

12. The process of claim 1, wherein the composition comprises a solvent 10 wt % or less based on a total amount of the composition.

13. A cured composition obtained or obtainable from the process of claim 1.

14. A layer obtained or obtainable from the process of claim 1.

15. The layer of claim 14, wherein the layer contains light emitting moieties, a matrix material and scattering particles, wherein a total amount of the light emitting moieties is in a range from 0.1 wt. % to 90 wt. % based on a total amount of the layer, and wherein a total amount of the scattering particles is 10 wt % or less based on the total amount of the layer.

16. The layer of claim 14, wherein a layer thickness of the layer is in a range from 1 to 50 μm.

17. A color conversion device comprising at least a first pixel partly or fully filled with the cured composition of claim 14, and a bank comprising at least a polymer material.

18. An optical device containing at least one functional medium configured to modulate a light or configured to emit light, and the color conversion device of claim 17.

19. A color conversion device comprising at least a first pixel partly or fully filled with the layer of claim 14, and a bank comprising at least a polymer material.

20. The layer of claim 15, wherein the total amount of the scattering particles is 1 to 5 wt % based on the total amount of the layer.

* * * * *